United States Patent
Counts et al.

(10) Patent No.: US 12,095,046 B2
(45) Date of Patent: *Sep. 17, 2024

(54) BATTERY PACK AND METHOD OF MANUFACTURE

(71) Applicant: Black & Decker Inc., Newark, DE (US)

(72) Inventors: Moriah Counts, Parkville, MD (US); Vy Ho, Towson, MD (US); Alexander R. Barton, Baltimore, MD (US); Nathan J. Cruise, Phoenix, MD (US)

(73) Assignee: BLACK & DECKER INC., New Britain, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/146,116

(22) Filed: Dec. 23, 2022

(65) Prior Publication Data
US 2023/0207899 A1 Jun. 29, 2023

Related U.S. Application Data

(63) Continuation of application No. 16/865,023, filed on May 1, 2020, now Pat. No. 11,563,239.
(Continued)

(51) Int. Cl.
*H01M 10/42* (2006.01)
*H01M 50/213* (2021.01)
(Continued)

(52) U.S. Cl.
CPC ....... *H01M 10/425* (2013.01); *H01M 50/213* (2021.01); *H05K 1/184* (2013.01);
(Continued)

(58) Field of Classification Search
CPC .......... H01M 10/425; H01M 10/6235; H01M 2010/4271; H01M 2220/30;
(Continued)

(56) References Cited

U.S. PATENT DOCUMENTS

2017/0025717 A1 1/2017 Zeller et al.
2020/0052257 A1 2/2020 Stanton et al.

FOREIGN PATENT DOCUMENTS

| DE | 102017103194 A1 * | 8/2018 | .......... H01M 10/425 |
|---|---|---|---|
| WO | 2015094035 A1 | 6/2015 | |
| WO | 2019236833 A1 | 12/2019 | |

OTHER PUBLICATIONS

Machine translation DE102017103194A1 (Year: 2018).*
European Search Report for EP Application No. EP 20172674, dated Oct. 16, 2020, 4 pages.

* cited by examiner

*Primary Examiner* — Victoria H Lynch
(74) *Attorney, Agent, or Firm* — Michael Aronoff

(57) ABSTRACT

A battery pack comprises a set of battery cells, a battery cell holder holding the battery cells, at least one battery strap having a first end connected to a terminal of one of the battery cells and a second end extending from the battery cell holder, a printed circuit board having a first side and a second side, components mounted on the second side of the printed circuit board, a trace on the second side of the printed circuit board extending from one components to a contact connected to the trace and mated with the second end of the at least one battery strap. Multiple vias extend from the first side to the second side, and the contact comprises a first portion having a through hole and a leg integrally formed with and approximately perpendicular to the first portion, the leg extending from the first side of the PCB to the second side of the PCB through a first via, the trace extending from the first via, the leg soldered to the second side of the PCB and the via and the through hole aligned with a second via adjacent to the first via, the through hole sized and configured to receive a PCB end of the strap, the PCB end of the strap soldered to the contact.

19 Claims, 44 Drawing Sheets

Related U.S. Application Data

(60) Provisional application No. 62/842,962, filed on May 3, 2019.

(51) Int. Cl.
    *H05K 1/18*     (2006.01)
    *H05K 3/34*     (2006.01)
    *H01M 50/271*     (2021.01)

(52) U.S. Cl.
    CPC ... *H05K 3/3447* (2013.01); *H01M 2010/4271* (2013.01); *H01M 50/271* (2021.01); *H01M 2220/30* (2013.01); *H05K 2201/10037* (2013.01); *H05K 2201/10757* (2013.01)

(58) Field of Classification Search
    CPC .. H01M 50/213; H01M 50/271; H05K 1/184; H05K 2201/10037; H05K 2201/10757; H05K 3/3447; Y02E 60/10
    See application file for complete search history.

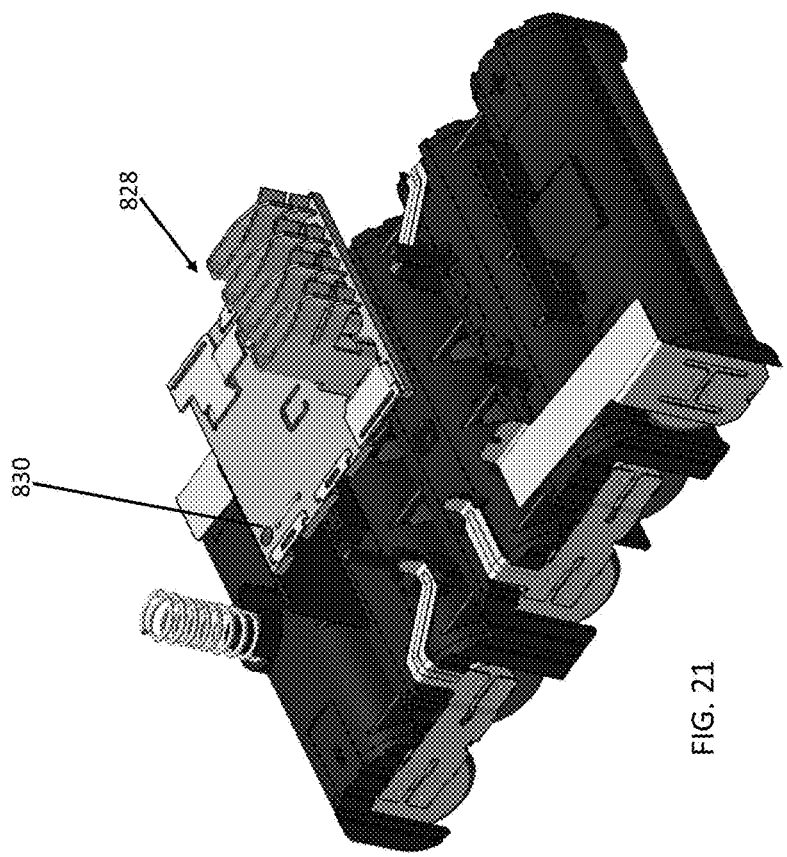
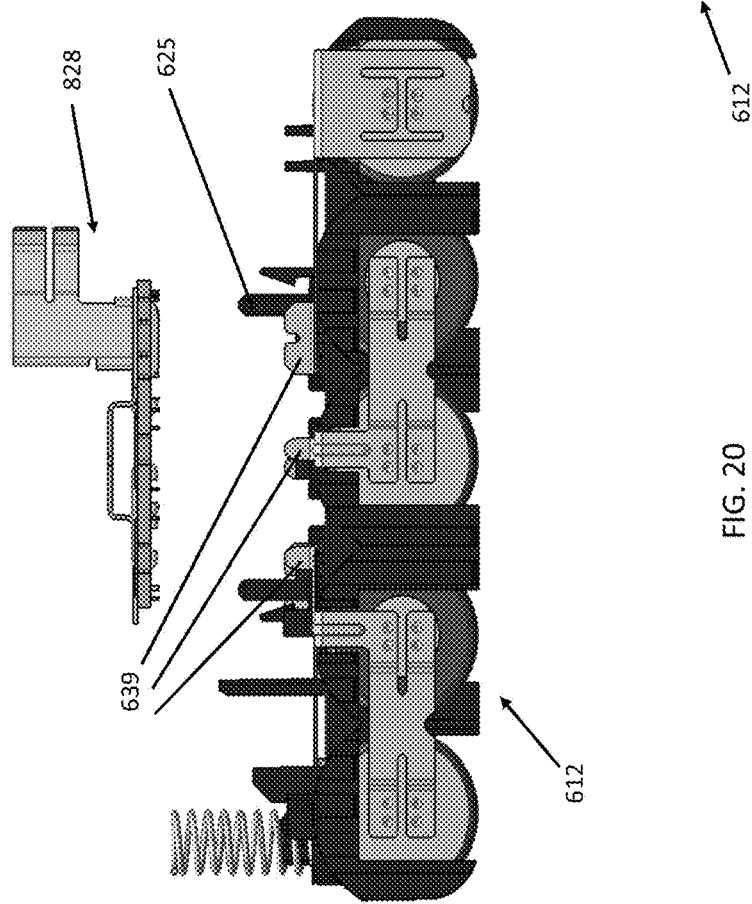
FIG. 20
FIG. 21

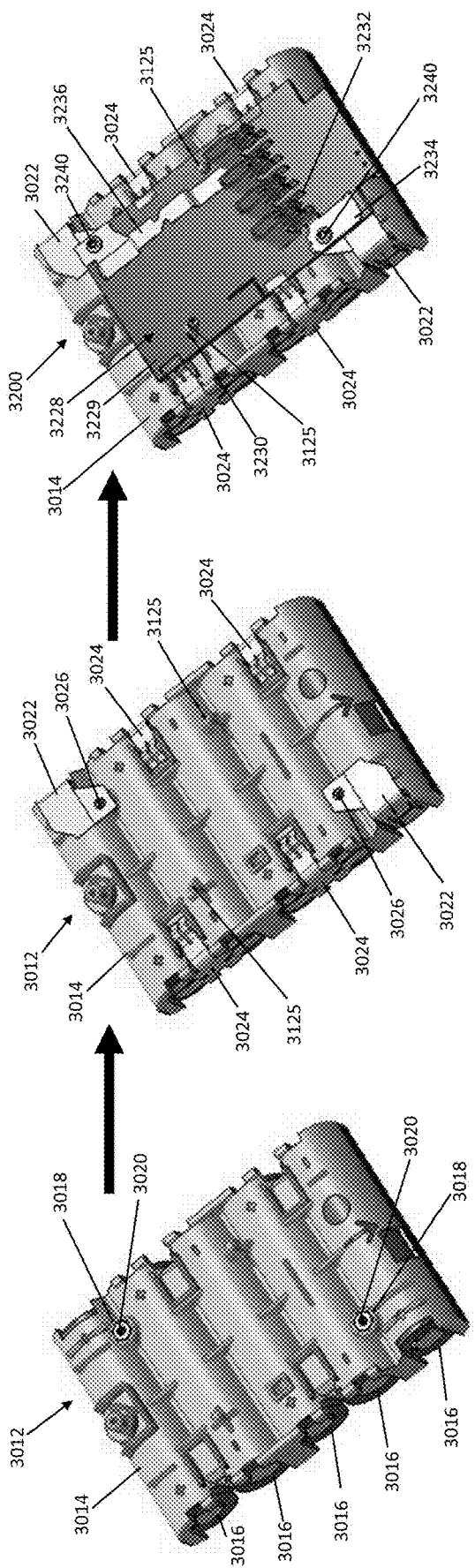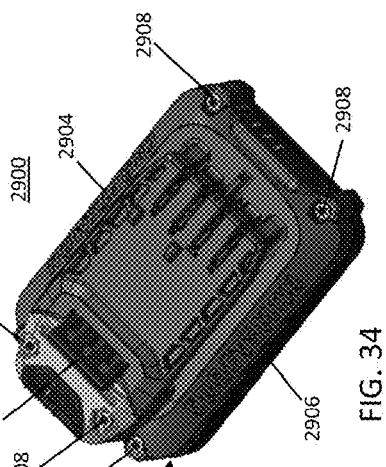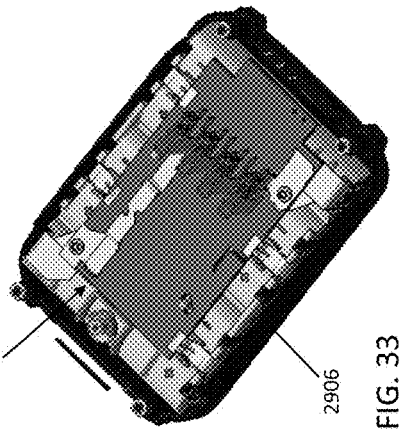

BATTERY PACK AND METHOD OF MANUFACTURE

RELATED APPLICATIONS

This application a continuation application of U.S. Pat. No. 11,563,239, filed May 1, 2020, and titled "Battery Pack And Method Of Manufacture," which claims priority to and the benefit of U.S. Provisional Application No. 62/842,962, filed, May 3, 2019, and titled "Battery Pack And Method Of Manufacture," which are herein incorporated by reference in their entireties.

TECHNICAL FIELD

This application relates to a battery pack and a method of manufacturing a battery pack. In one implementation, the method for assembling and electrically coupling a single sided printed circuit board to set of battery cells.

BACKGROUND

Battery packs for cordless power tools may include a printed circuit board (PCB). Typically, the printed circuit board includes components and electrical traces on both sides of the board and test points on one side of the board. This enables the battery straps to be soldered to a via associated with a trace on a top side of the PCB (facing away from the cells/cell holder). This enables the battery strap to be soldered to the via (and electrically coupled to the trace) after the PCB has been combined with the cell holder. Having traces and/or test points and/or components on a side of a PCB requires a layer of copper on that side, etching the copper to remove any unnecessary copper and a coating layer to protect the traces. This adds significant cost in material and time to the production of the PCB.

In order to reduce the cost of the PCB one can have all of the traces on a single side of the PCB and attach all of the components to the same, single side of the PCB (i.e., not have any components attached to or traces on a second side of the PCB). For example, a component may be placed on a first (top) side of the PCB put a connection feature is received in a through hole of the PCB and the component—that is placed on the top side of the PCB—is connected to the PCB by the connection feature on the second (bottom) side of the PCB by way of solder, for example. In this manner, the battery pack terminals and all of the electrical/electronic components that need to be attached to the PCB can be wave soldered or otherwise attached to the PCB in a single pass.

FIGS. 1 and 2 illustrate an example battery pack 100. The battery pack 100 includes a housing 102. The housing 102 may include a top housing portion 104 and a bottom housing portion 106. The top and bottom housing portions may be held together by a plurality of fasteners, such as screws. The battery pack 100 may also include a latch 110 to mechanically couple the battery pack 100 to cordless, battery operated power tools or other cordless, battery operated devices.

FIGS. 3 through 5 illustrate a conventional battery pack which may include a housing illustrated in FIGS. 1 and 2. This battery pack includes a housing (only the bottom housing portion 306 being illustrated) and a battery corepack 300. The battery corepack 300 includes a PCB module 328 and a battery. The PCB module 328 includes a printed circuit board (PCB) 329, a plurality of battery pack terminals 332, a plurality of PCB traces 331 on a top side of the PCB wherein many of the PCB traces 331 lead to solder points 333 or test points on the top side of the PCB. The battery includes a battery cell holder 314, a plurality of battery cells, and battery cell straps 322 and 324 for coupling the battery cells to the PCB module 328.

As illustrated, in this battery pack the battery cell straps 322 and 324 include stamped metal contacts and wires soldered to the stamped metal contact and a soldered to the PCB 329. In this battery pack, when creating the PCB a layer of copper would have to be applied to the board and etched (removal of copper material) to provide the traces 331, solder points 333 and test points. This would result in a significant amount of wasted copper. The resulting traces 331 and solder points 333 allow the battery cell straps 322 and 324 to be soldered—or otherwise connected—to the PCB 329 after the PCB module 328 has been combined with the battery. The test points allow the corepack 300 to be tested after the PCB module 328 has been combined to the battery to insure that the corepack 300 meets the predetermined standards.

However, if there aren't any traces on the top side of the PCB (all of the traces of the PCB are on the bottom side/side facing the cell holder) then there aren't any contact points for the battery straps to be soldered to (in order to couple the battery cells to the various electrical/electronic components on the PCB) after the PCB has been combined with the cell holder. The below detailed description provides solutions that addresses this and other issues.

SUMMARY

In one general aspect, a battery pack comprises a set of battery cells including at least two battery cells, a battery cell holder holding the battery cells in a fixed position relative to each other, at least one battery strap having a first end connected to a terminal of at least one of the battery cells and a second end extending from the battery cell holder, a printed circuit board having a first side and a second side, a plurality of components mounted on the second side of the printed circuit board, a trace on the second side of the printed circuit board extending from one of the plurality of components to a contact connected to the trace and mated with the second end of the at least one battery strap.

The aforementioned battery pack wherein the printed circuit board includes a plurality of vias extending from the first side to the second side, and the contact comprises a first portion having a through hole and a leg integrally formed with and approximately perpendicular to the first portion, the leg extending from the first side of the PCB to the second side of the PCB through a first via, the trace extending from the first via, the leg soldered to the second side of the PCB and the via and the through hole aligned with a second via adjacent to the first via, the through hole sized and configured to receive a PCB end of the strap, the PCB end of the strap soldered to the contact.

Advantages may include one or more of the following: a battery pack having reduced materials cost and reduced assembly time and costs.

These and other advantages and features will be apparent from the description and the drawings.

BRIEF DESCRIPTION OF THE DRAWINGS

FIG. 20 is a side view of the printed circuit board module of FIG. 12 and the battery of FIG. 17 prior to combination.

FIG. 21 is an isometric view of the printed circuit board module and battery of FIG. 20.

FIG. 30 is an isometric view of a battery of the battery pack of FIG. 29.

FIG. 31 is an isometric view of the battery of FIG. 30 with battery straps attached.

FIG. 32 is an isometric view of the battery of FIG. 30 and a printed circuit board module forming a corepack.

FIG. 33 is an isometric view of the corepack of FIG. 32 inserted in a bottom housing portion of the battery pack of FIG. 29.

FIG. 34 is an isometric view of the battery pack of FIG. 29 with a top housing portion of the battery pack secured to the bottom housing portion of the battery pack.

DETAILED DESCRIPTION

Figure 2:
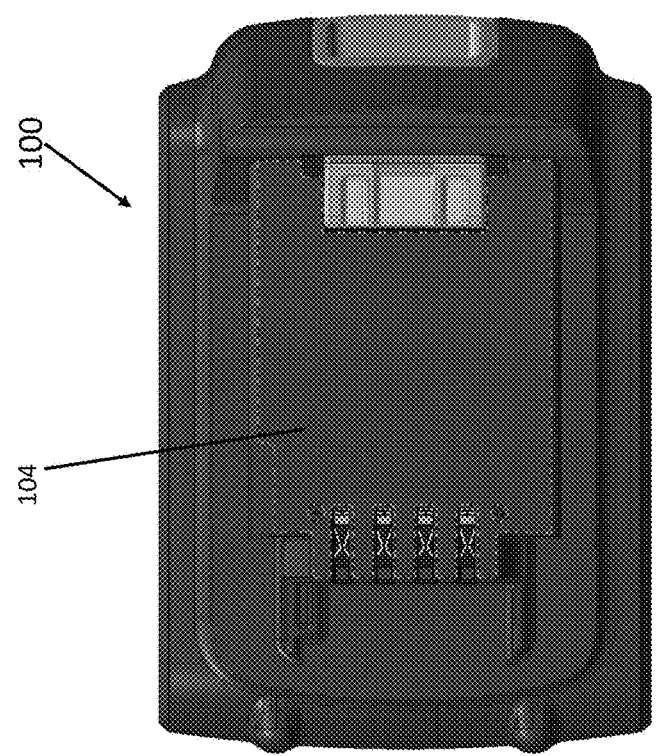
FIG. 2 is a top view of the battery pack of FIG. 1.
Figure 1:
FIG. 1 is an isometric view of a battery pack.
Figure 3:
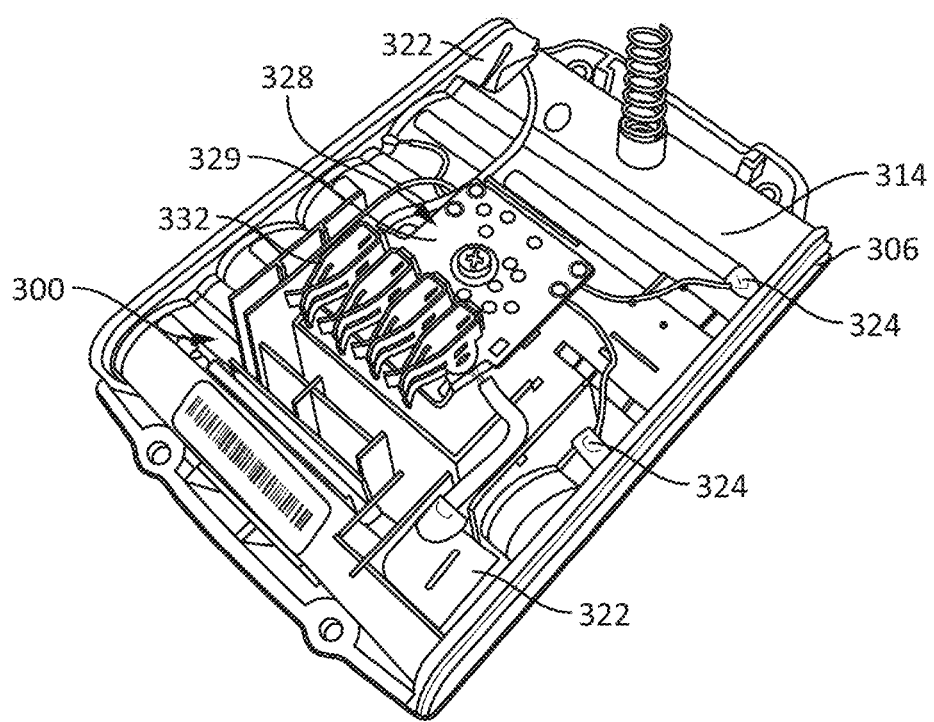
FIG. 3 is an isometric view of a conventional battery pack with a top portion of the battery pack housing removed.
Figure 4:
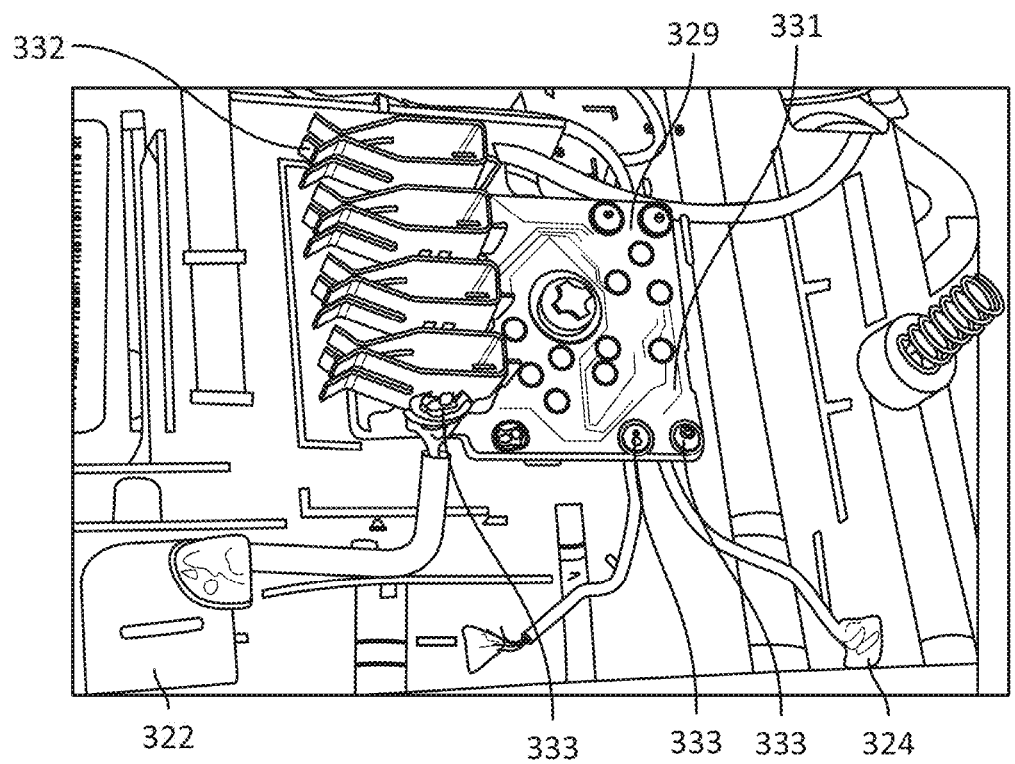
FIG. 4 is a top view of the battery pack of FIG. 3.
Figure 5:
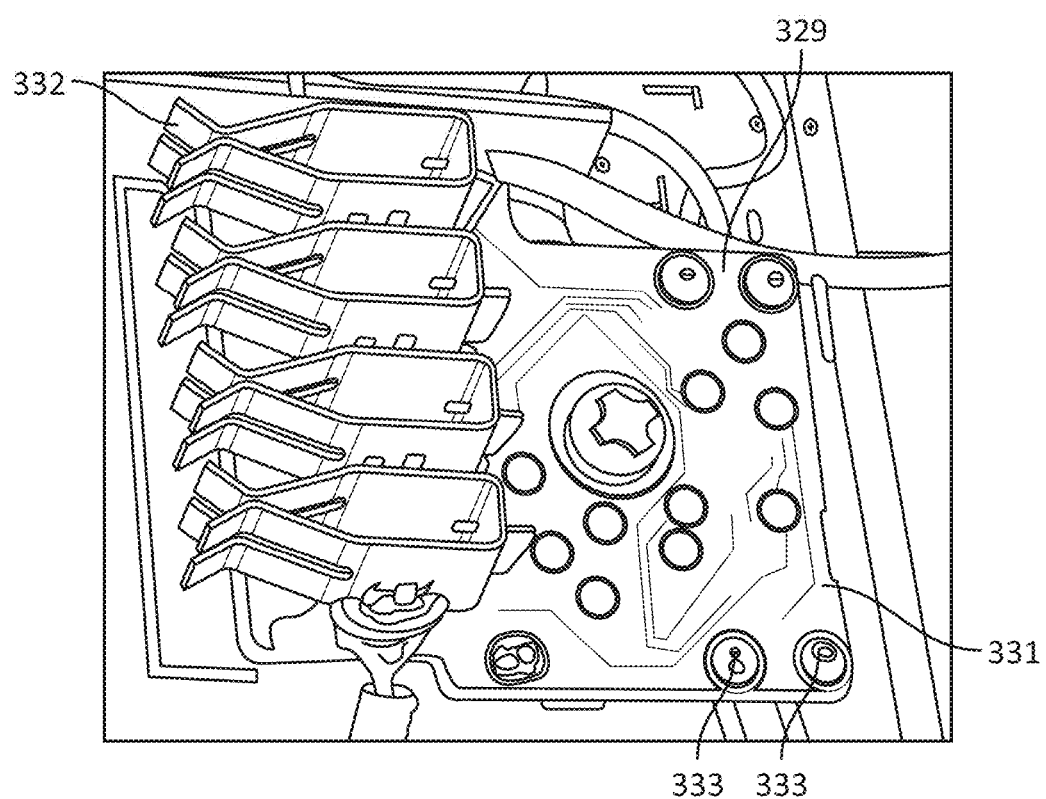
FIG. 5 is top view of a PCB and battery pack terminals of the battery pack of FIG. 3.
Figure 6:
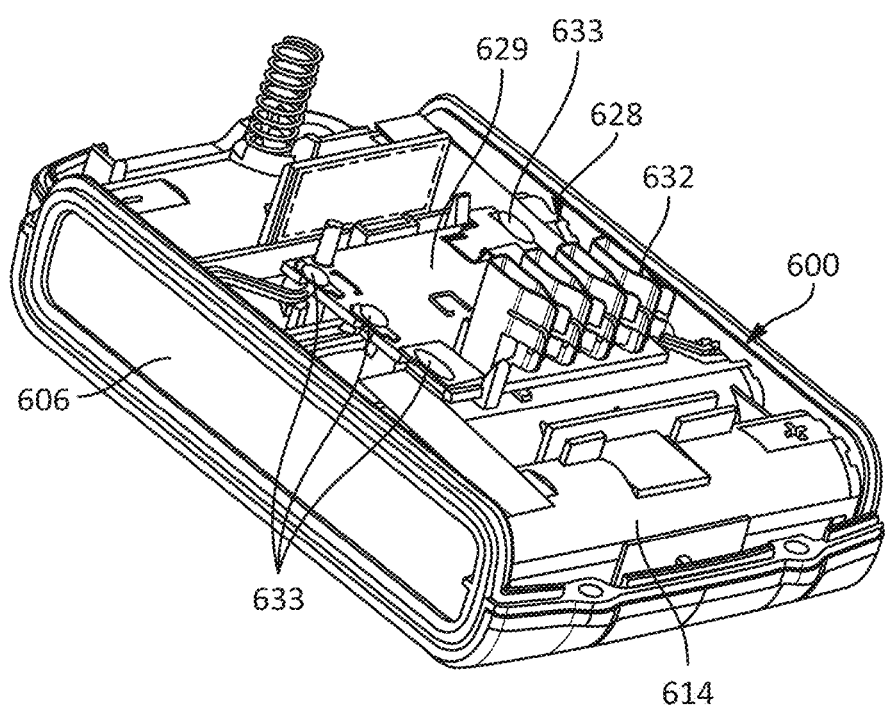
FIG. 6 is an isometric view of an example embodiment of a battery pack with a top portion of the battery housing removed.
Figure 7:
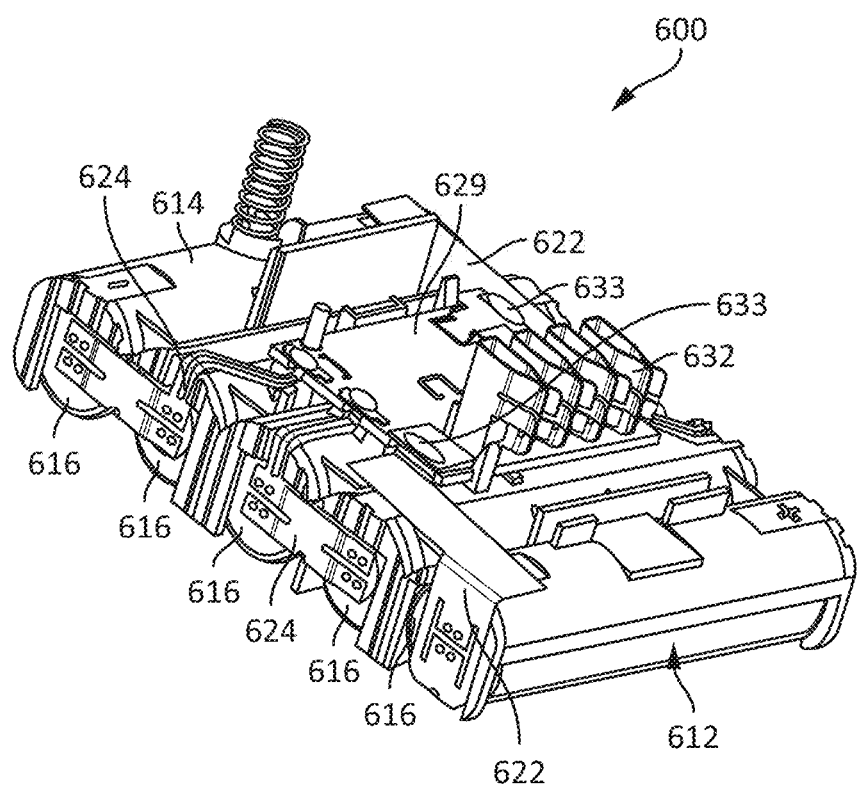
FIG. 7 is an isometric view of a corepack of the battery pack of FIG. 6.

FIG. 6 illustrates a battery pack including the features that present solutions to the issues identified above, where the battery pack may include a housing illustrated in FIGS. 1 and 2. FIG. 6 illustrates a bottom housing portion 606 (the top housing portion having been removed) and the battery corepack 600. Similar to the conventional battery pack illustrated in FIGS. 3-5, the battery pack of FIG. 6 includes a corepack 600 comprising a PCB module 628 and a battery 612. As illustrated in FIG. 7, the PCB module 628 includes a PCB 629 and a plurality of battery pack terminals 632. The battery 612 includes a plurality of battery cells 616, a battery cell holder 614 for holding the battery cells 616 in a fixed relationship to each other and a plurality of battery cell straps 622 and 624. As also illustrated in FIG. 7, the battery cell straps 622 and 624 include a battery cell end and a PCB end. The battery cell end is connected to one or more battery cell terminals to connect (string) together the plurality of battery cells 616. The PCB end is shaped and configured to be received in corresponding holes/vias/cutouts in the PCB, described in more detail below.

As also illustrated in FIG. 7, the PCB end of the battery cell straps 622 and 624 is soldered 633 to corresponding strap contacts 1100 of the PCB module—to be described in more detail below. The battery cell straps 622 and 624 may be connected to the strap contacts in other manners, for example, laser welding.

Figure 8:
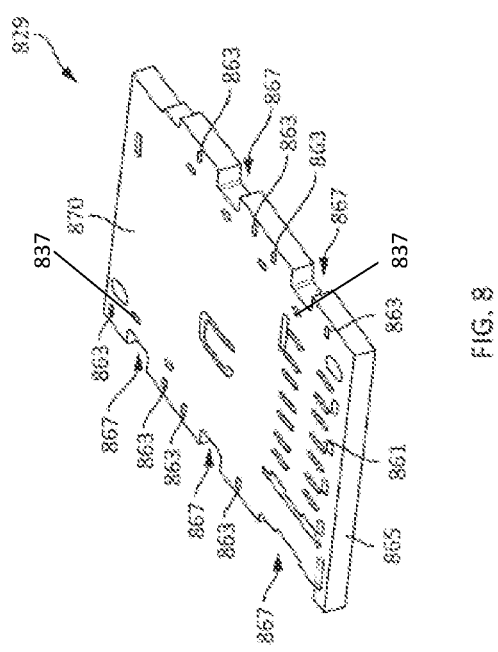
FIG. 8 is an isometric view of an example printed circuit board of the battery pack of FIG. 6.
Figure 9:
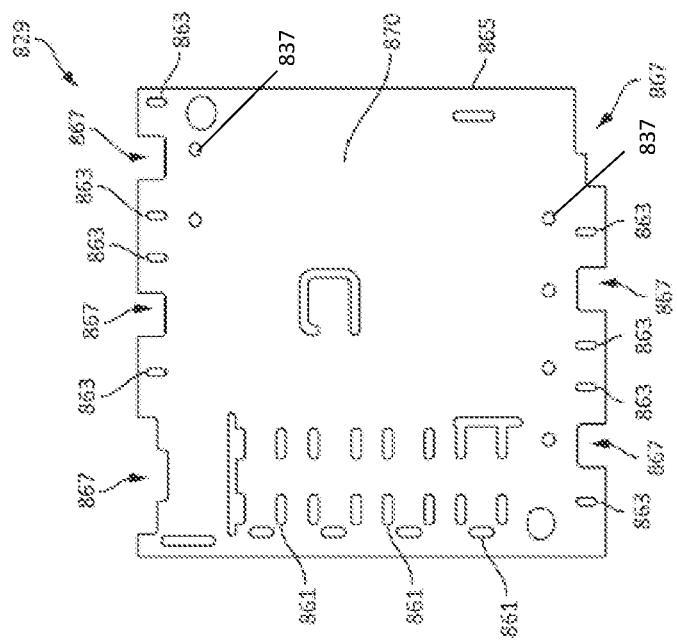
FIG. 9 is a top view of the printed circuit board of FIG. 8.
Figure 10:
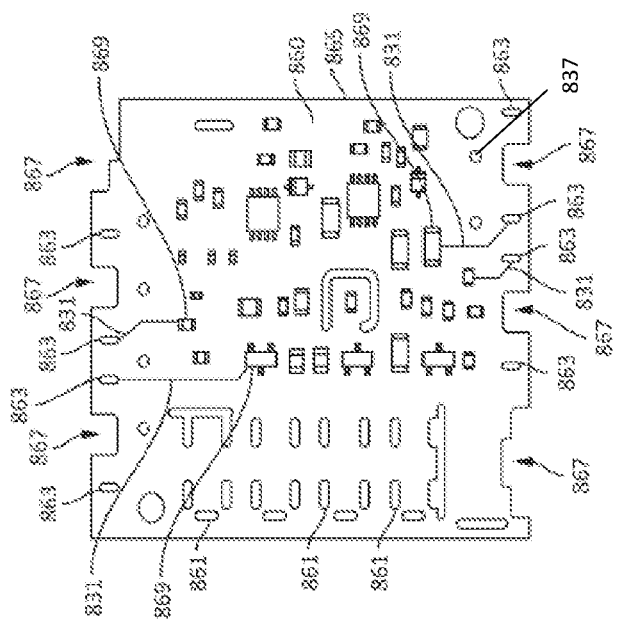
FIG. 10 is a bottom view of the printed circuit board of FIG. 8 including various mounted components and printed circuit board traces.
Figure 11:
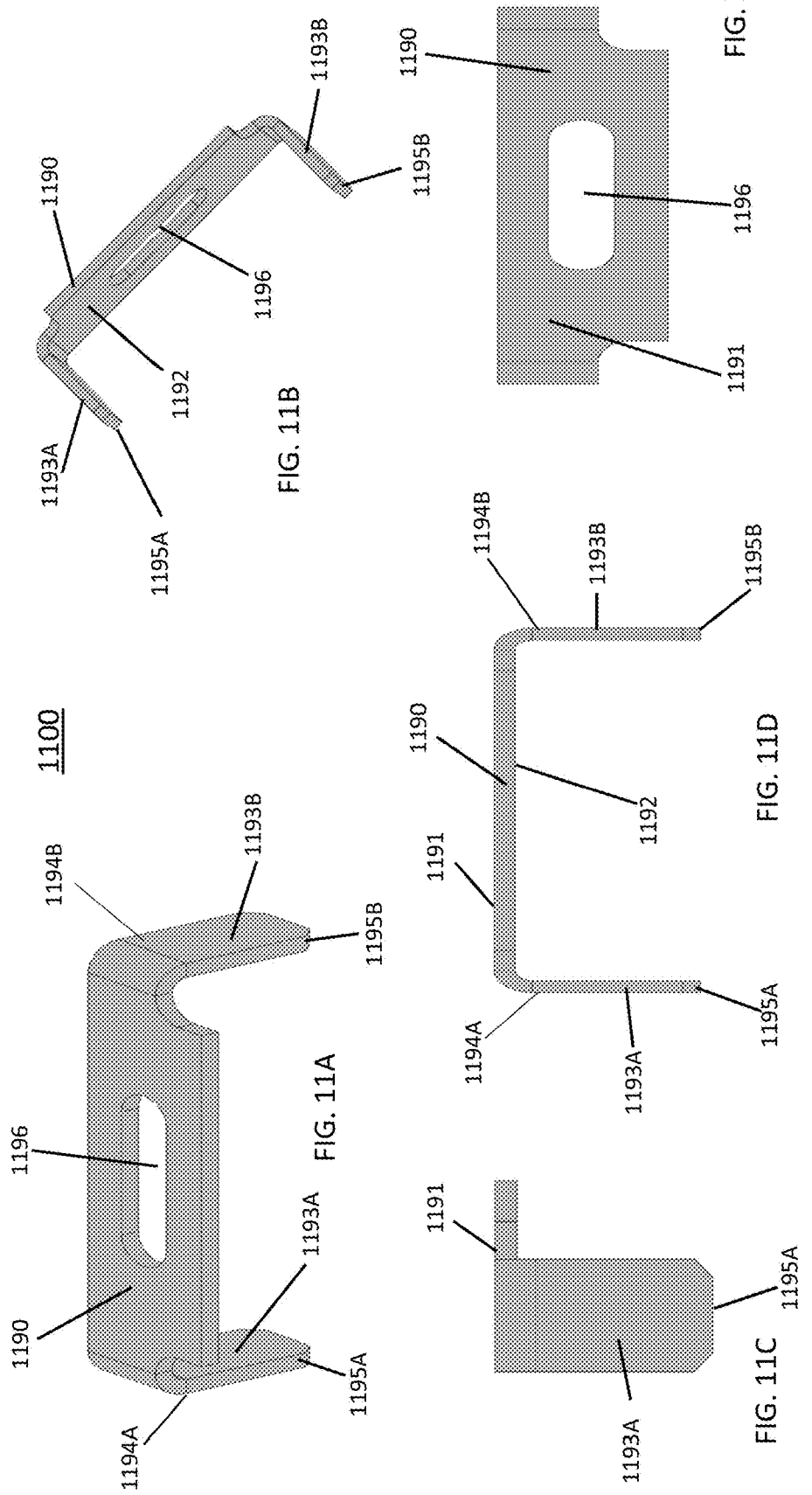
FIGS. 11A-11E are various view of an example strap contact of the battery pack of FIG. 6.

FIGS. 8 through 10 illustrate the PCB 829 of the PCB module. The PCB 829 includes a top side 870 and a bottom side 860 connected by a sidewall 865. The PCB 829 includes a variety of through holes. The through holes may also be referred to as vias. The through holes are associated with various types of components. More specifically, there are through holes 861 for the battery pack terminals 832, through holes 863 for strap contacts 1100, through holes 837 for test contacts 888, and through holes 867 for battery cell straps 622, 624. The through holes 861 for the battery pack terminals 832 are sized and configured to receive a portion of the battery pack terminals 832. The through holes 863 for the strap contacts 1100 are sized and configured to receive the strap contacts 1100. The through holes 867 for the battery cell straps 622, 624 are sized and configured configures to receive the battery cell straps 622, 624. The battery cell strap through holes may alternatively be formed as cutouts 867 in the PCB sidewall to provide easier placement of the battery cell straps 622, 624.

FIG. 10 illustrates the bottom side 860 (the side of the PCB that will face the battery cell holder) of the PCB. As illustrated, there are several components 869 mounted on the bottom side of the PCB connected to a PCB trace 831. The components may include resistors, capacitors, or integrated circuits. These components may be attached to the PCB by wave soldering or other similar attachment process.

As illustrated in FIGS. 8-10, several of the battery cell strap through holes/cutouts 867 include a pair of associated strap contact through holes 863. One of the pair of strap contact through holes 863 is positioned on each side of the battery cell strap through hole/cutout 867. As illustrated in FIG. 10 one of the strap contact through holes 863 of each pair of strap contact through holes 863 is connected with a PCB trace 831 that connects the strap contact through hole 863 to a mounted component 869.

FIGS. 11A through 11E illustrate an example embodiment of a strap contact 1100. This strap contact 1100 may be made of a conductive metal material and stamped to provide its shape. The strap contact 1100 may include a center portion 1190 having a top side 1191 and a bottom side 1192. The top side 1191 will face away from the top side of the PCB and the bottom side 1192 will face towards the top side of the PCB once the strap contact 1100 is mounted on the PCB. The strap contact 1100 may include at least one leg. In this example embodiment, the strap contact 1100 may also include a first leg 1193A and a second leg 1193B (a pair of legs) extending from two opposing ends of the center portion 1190. A first end 1194A of the first leg 1193A is integrally formed with a first of the two opposing ends of the center portion 1190 and a first end 1194B of the second leg 1193B is integrally formed with a second of the opposing ends of the center portion 1190. A second end 1195A of the first leg 1193A is free and shaped to be received in one of the holes formed in the PCB. A second end 1195B of the second leg 1193B is free and shaped to be received in one of the holes formed in the PCB. The center portion 1190 of the strap contact may include a contact through hole 1196. The through hole 1196 extends from the top side 1191 to the bottom side 1192. The through hole 1196 is shaped to receive the PCB end of the battery cell strap. In other example embodiments, the strap contact 1100 may include two or more legs.

FIGS. 12 through 16 illustrate the PCB module 828, which may be the same as the PCB module 628 of FIG. 6 and the PCB module 828 of FIG. 8. The PCB module 828 may include the printed circuit board (PCB) 829, the battery pack terminals 832, the strap contacts (power 1100A and sense 1100B), components 869 mounted on the bottom side of the PCB 829, and PCB traces 831. The PCB 829 also may include alignment holes 830 that are configured to receive alignment posts on the battery cell holder and test contacts 837 that are mounted on the top of the PCB 829 and which extend to the bottom side of the PCB using through holes where the ends of the test contacts 837 are soldered to the PCB and to one or more electrical traces. The power strap contacts 1100A and the sense strap contacts 1100B include the same features and structure as the strap contact 1100 illustrated in FIG. 11. In some implementations, the power strap contacts 1100A may be a larger strap contact than the strap contact 1100 illustrated in FIG. 11 and the sense strap contacts 1100B. For example, the power strap contacts 1100A may include a larger center portion having more surface area than the strap contact 1100 and the sense strap contacts 1100B.

Figure 12:
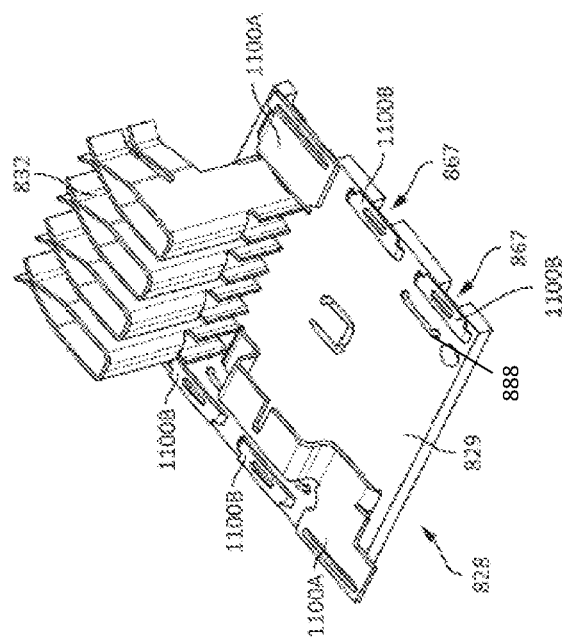
FIG. 12 is an isometric view of a printed circuit board module of the battery pack of FIG. 6.
Figure 13:
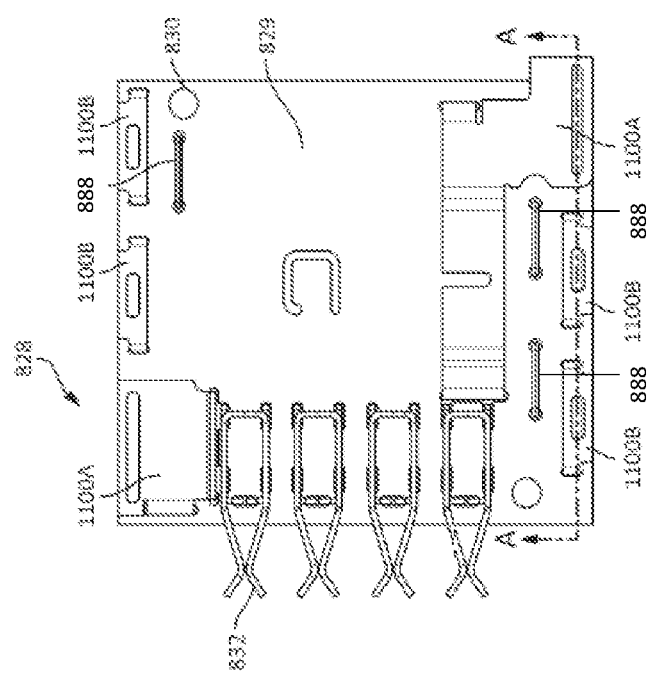
FIG. 13 is a top view of the printed circuit board module of FIG. 12.
Figure 14:
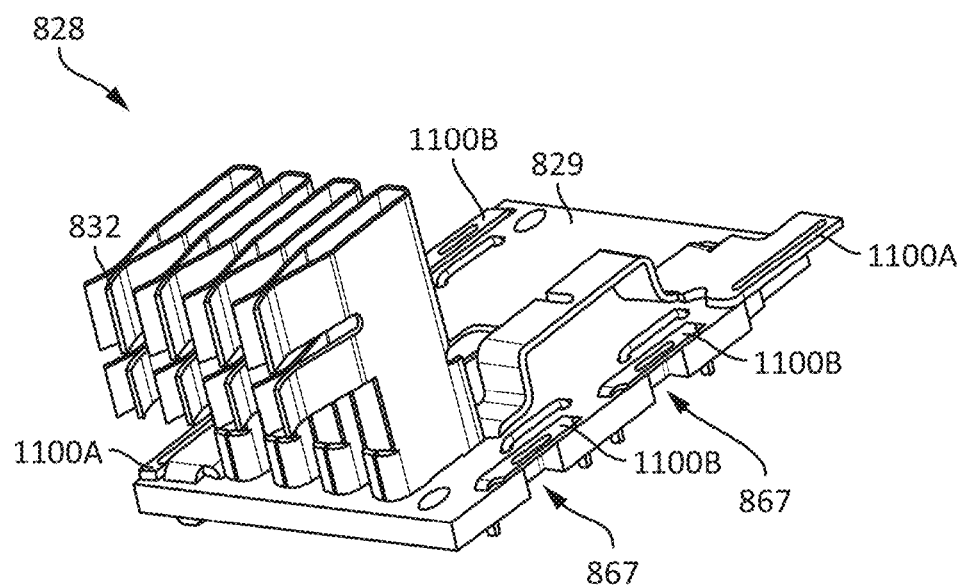
FIG. 14 is another isometric view of the printed circuit board module of FIG. 12.

As illustrated in FIGS. 12-14, the strap contacts—both power strap contacts 1100A and sense strap contacts 1100B—and the battery pack terminals 832 are placed on the top side of the PCB 829 with the free ends of the strap contacts received in the strap contact holes/vias on opposing sides of the strap cutouts/holes and a mounting portion of the battery pack terminals 832 received in the battery pack terminal through holes. As such, the through hole 1196 of the strap contact 1100B aligns with the corresponding, associated strap cutout/hole 867.

Figure 15:
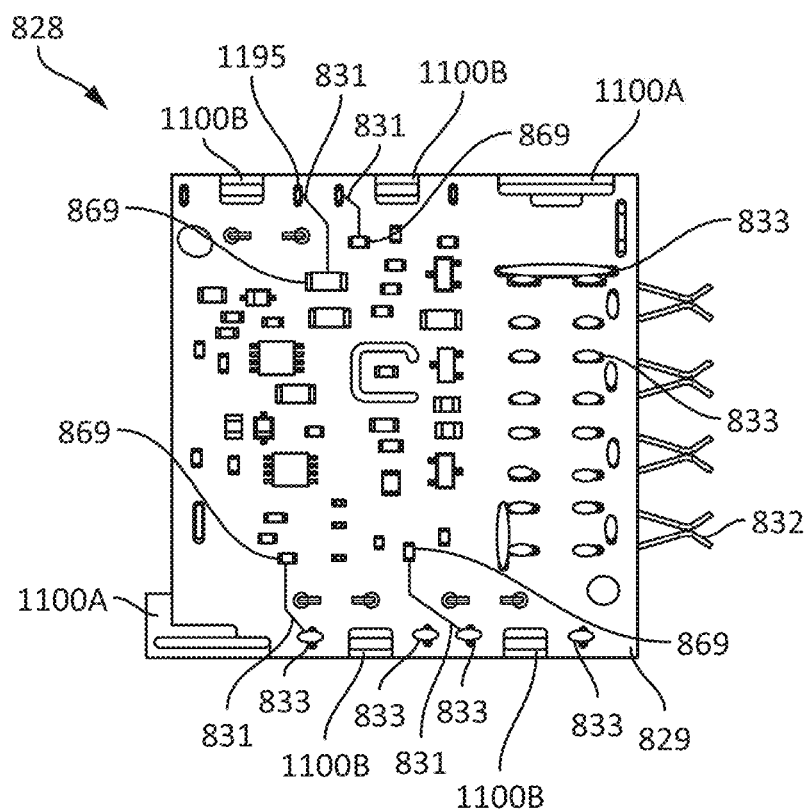
FIG. 15 is a bottom view of the printed circuit board module of FIG. 12.

As illustrated in FIG. 15, the mounting portion of the battery pack terminals 832 are soldered 833 to the bottom side of the PCB 829. As such, the battery pack terminals 832 are electrically and mechanically coupled to PCB traces (not shown) on the bottom side of the PCB. These traces lead to various components mounted on the bottom side of the PCB. The free legs 1193 of the strap contact 1100B are also soldered 833 to the bottom side of the PCB 829. As noted above, a PCB trace 831 is associated with one of the strap contact through holes of each pair of strap contact through holes. Once the strap contact 1100B is soldered 833 to the through hole the strap contact 1100B is electrically coupled to a component 869 mounted on the bottom side of the PCB through the associated PCB trace 831. In FIG. 14, only some of the strap contact leg free ends 1195 are shown to be soldered 833 to the bottom side of the PCB. In a finished product, all of the strap contact leg free ends 1195 will be soldered to the bottom side of the PCB. It is contemplated that the strap contact leg free ends may be coupled to the bottom side of the PCB by methods other than soldering.

Figure 16:
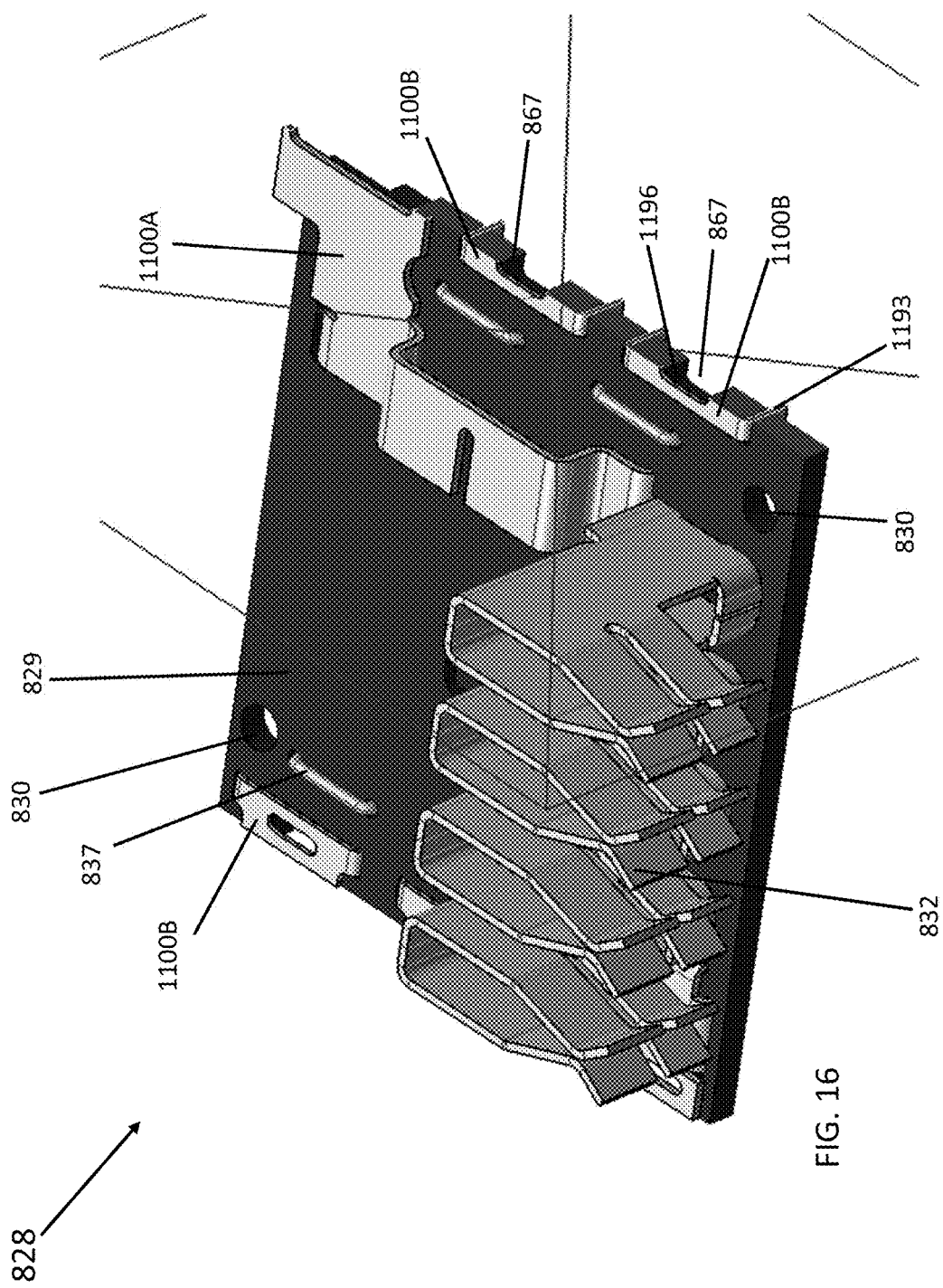
FIG. 16 is a section view of the printed circuit board module taken along section line A-A of FIG. 13.

As illustrated in the cross section view of FIG. 16, the legs 1193 of the strap contact 1100B extend from the top side of the PCB 829 through the strap contact through hole to the bottom side of the PCB. The free end 1195 of the strap contact leg 1193 extends slightly beyond the bottom side of the PCB to enable soldering 833 of the strap contact leg to the bottom side of the PCB. Furthermore, the battery cell strap hole/cutout 867 aligns with the corresponding, associated strap contact through hole 1196.

Figure 17:
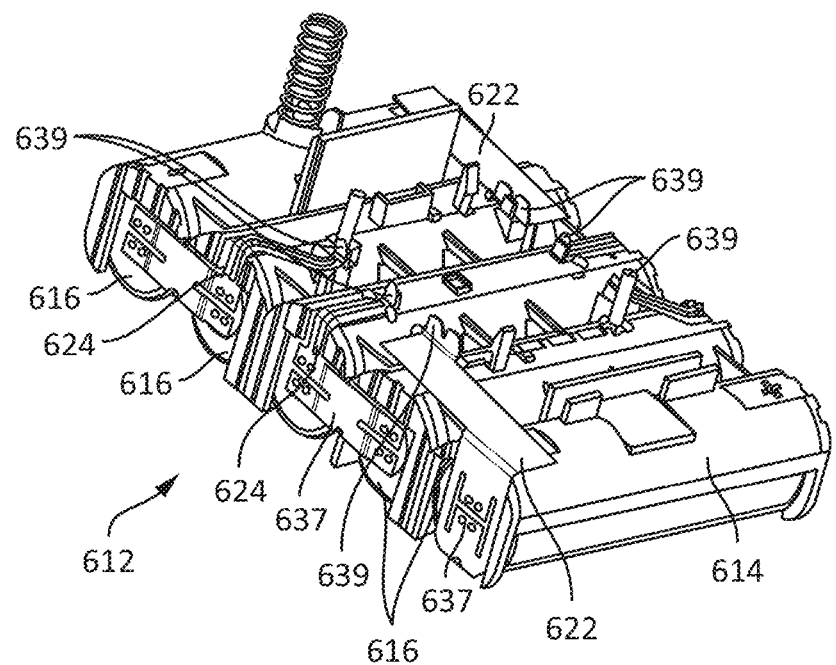
FIG. 17 is an isometric view of a battery of the battery pack of FIG. 6.
Figure 18:
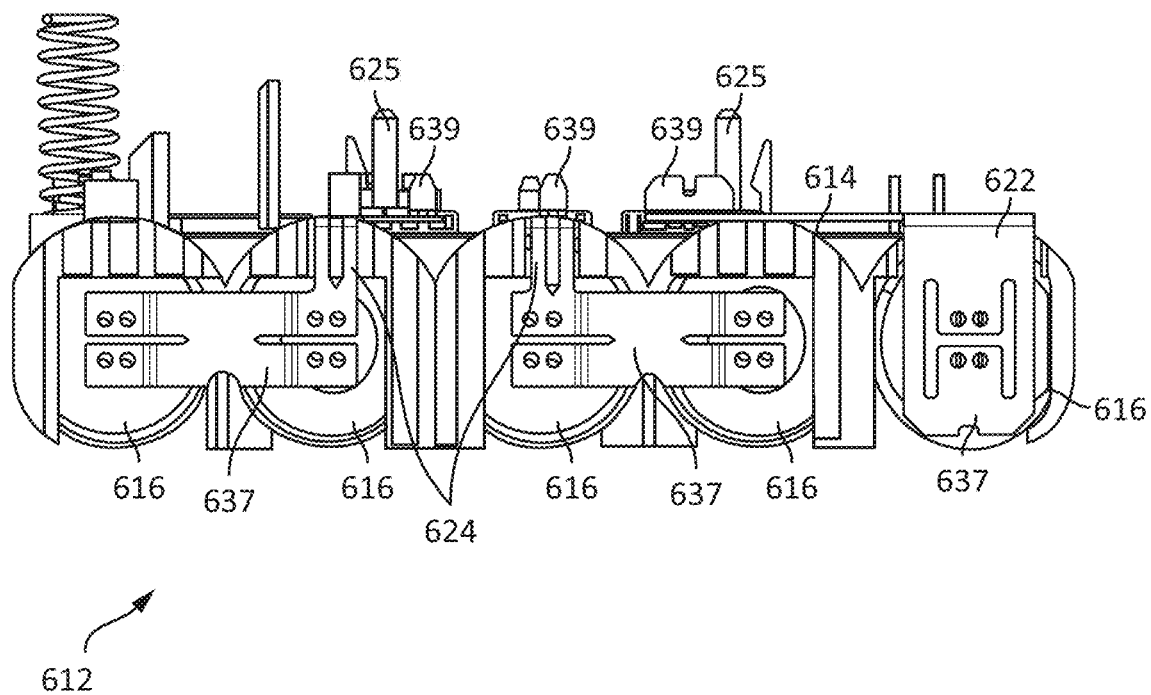
FIG. 18 is a side view of the battery of FIG. 17.
Figure 19:
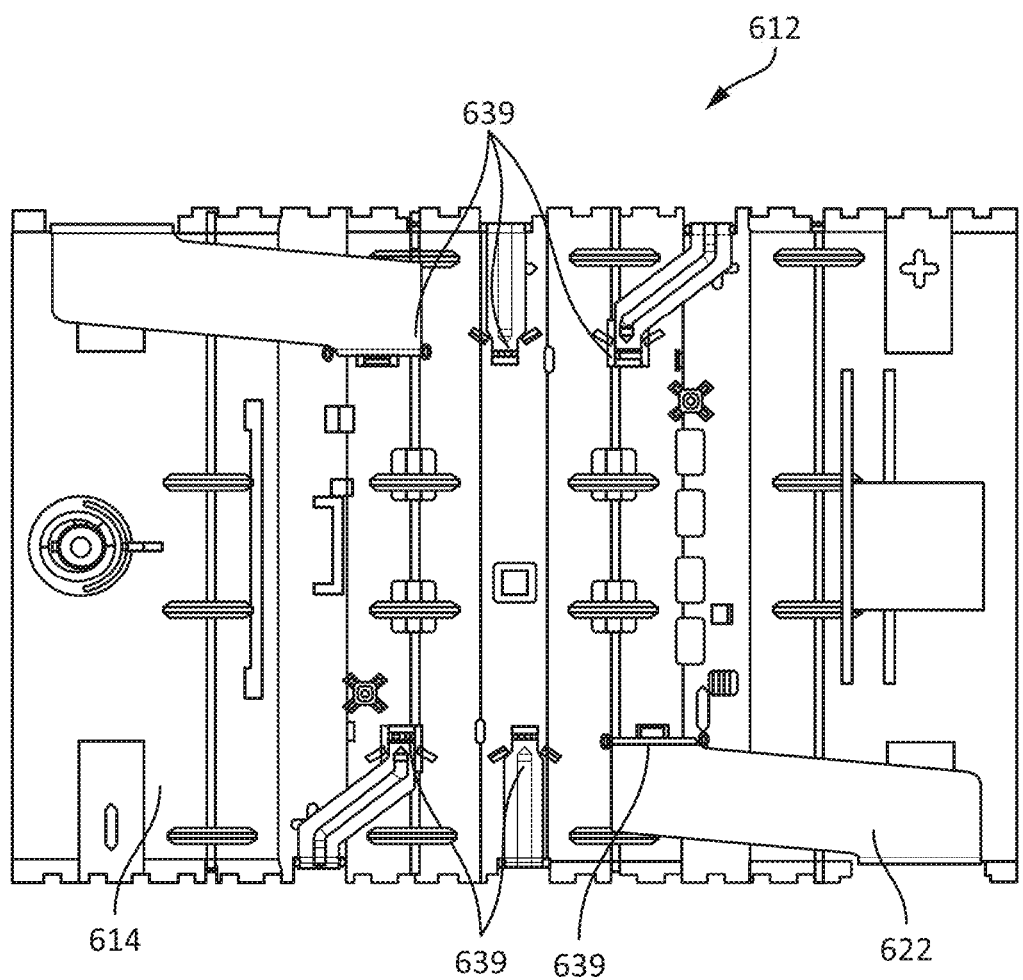
FIG. 19 is a top view of the battery of FIG. 17.

FIGS. 17-19 illustrate the battery 612, where the battery 612 may be the same battery 612 of FIG. 6. The battery 612 includes a plurality of battery cells 616, a battery cell holder 614 that receives and holds the battery cells 616 in a fixed position relative to the other, and a plurality of battery cell straps 622 and 624. The battery cell holder 614 also includes one or more alignment posts 625. There are two types of battery cell straps: power battery cell straps 622 and sense battery cell straps 624, in this example embodiment. The battery includes two power battery cell straps 622 (a positive power battery cell strap and a negative power battery cell strap) and four sense battery cell straps 624. Each battery cell strap includes a cell end 637 and a PCB end 639. The cell end 637 of the positive power battery cell strap is connected to the positive terminal of the most positive battery cell 616 in the string of battery cells and the cell end 637 of the negative power battery cell strap is connected to the negative terminal of the most negative battery cell in the string of battery cells. The cell end 637 of the sense battery cell straps 624 are connected to a positive terminal of a first battery cell and a negative terminal of a second battery cell thereby creating an electrical node between the first battery cell and the second battery cell. Once all of the battery cell straps are connected to the battery cells, a pack voltage is established between the positive power battery cell strap and the negative power battery cell strap. The PCB end 639 of the battery cell strap is connected to the cell end of the battery cell strap by a strap arm. The strap arm extends from the side of the battery cell holder to the top of the battery cell holder (side of the battery cell holder facing the PCB module). The PCB end 639 of the battery cell strap extends from the top of the battery cell holder and is shaped and configured to be received by the strap contact through the strap contact center through hole.

Figure 22:
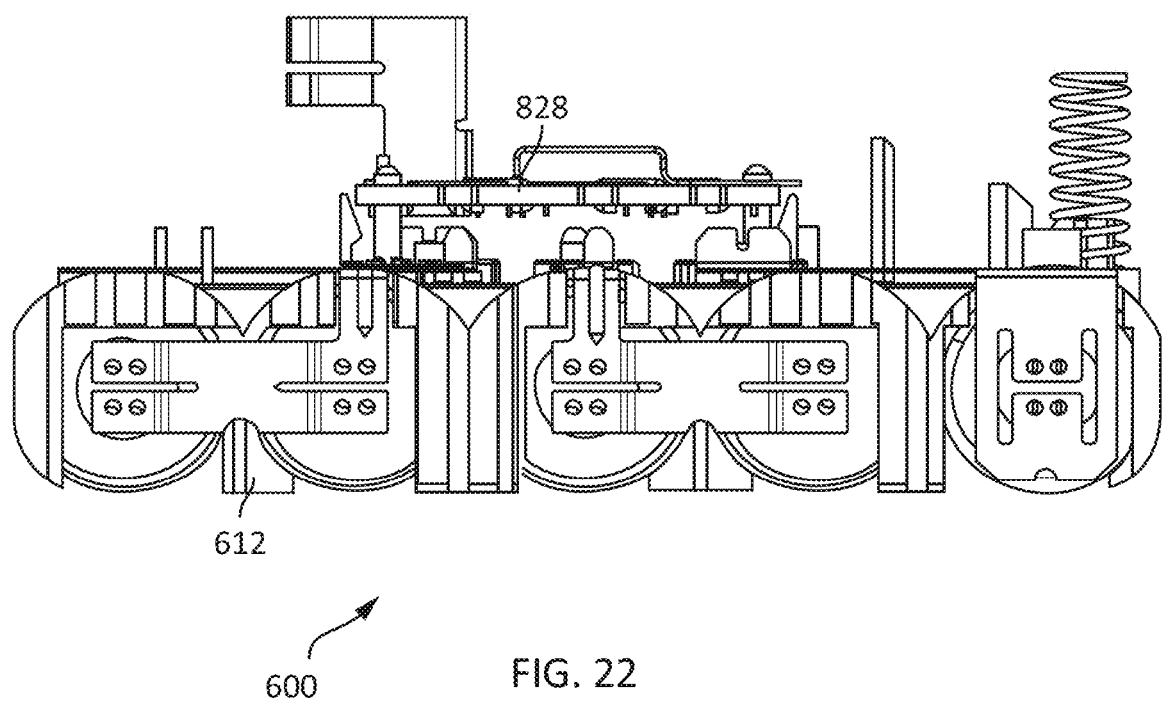
FIG. 22 is a side view of the printed circuit board module and battery of FIG. 20 prior to combination.
Figure 23:
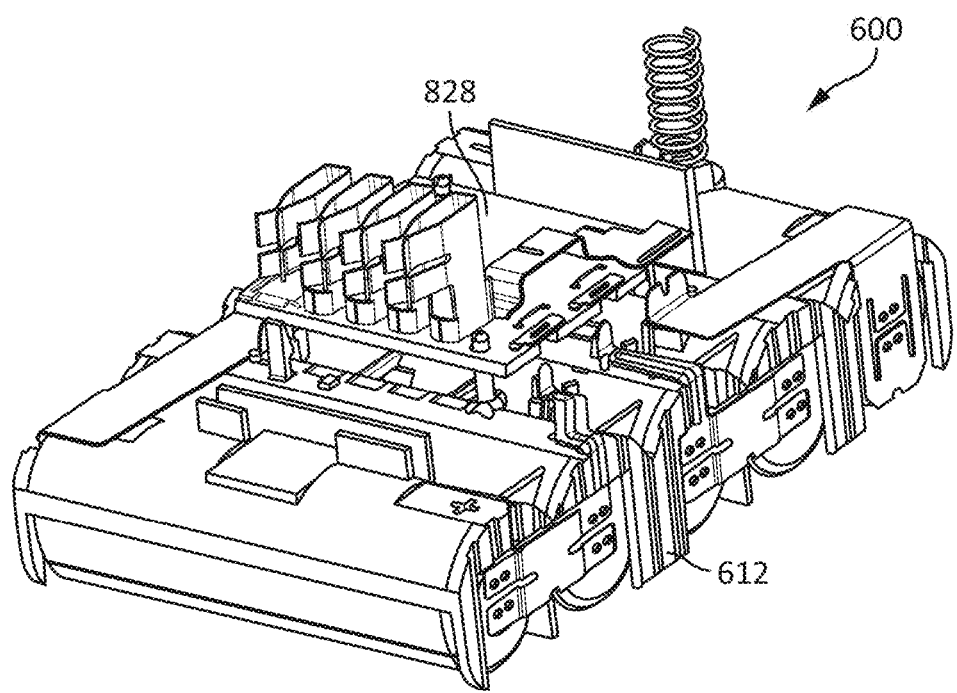
FIG. 23 is an isometric view of the printed circuit board module and battery of FIG. 22.

FIGS. 20-28 illustrate the assembly process for combining the PCB module 828 and the battery 612. As noted above, he PCB module 828 of FIG. 8 is a same PCB module 628 of FIG. 6. As illustrated in FIGS. 20 and 21, the PCB module 828 is aligned with the battery 612 such that the alignment holes 830 of the PCB module 828 align with the alignment posts 625 of the battery 612. As illustrated in FIGS. 22 and 23, as the PCB module 828 and the battery 612 are moved closer to each other (either the PCB module 828 moving towards the battery 612 or the battery 612 moving towards the PCB module 828) the alignment posts 625 are received in the alignment holes 830.

Figure 24:
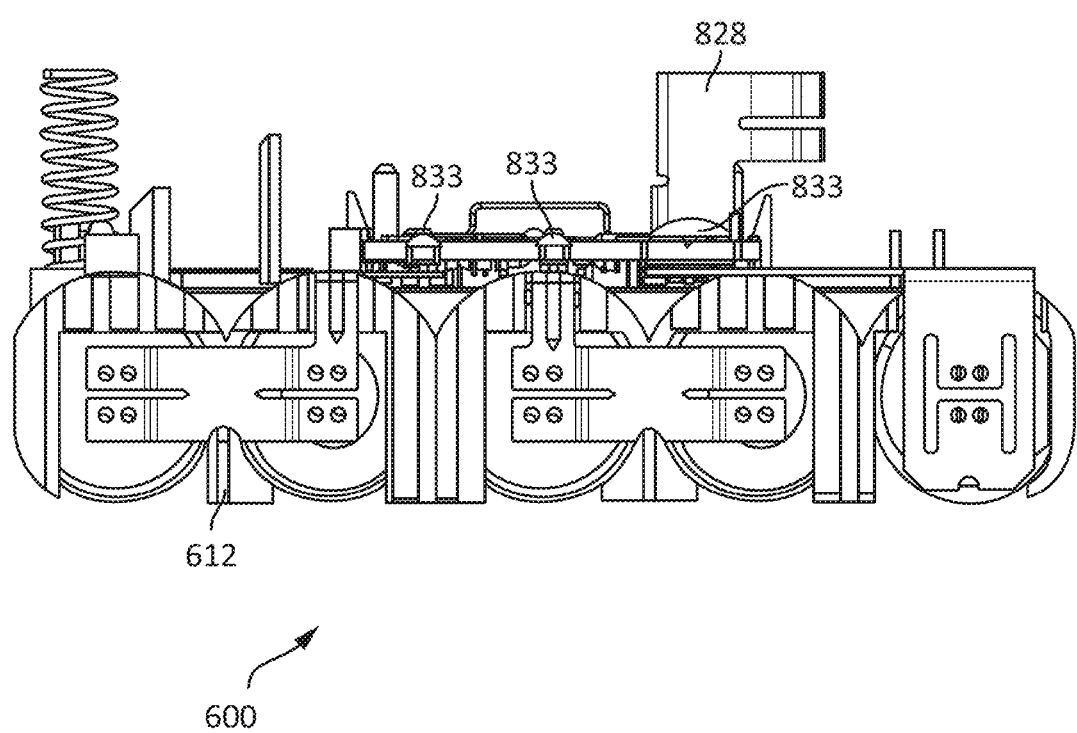
FIG. 24 is a side view of the corepack of the example battery pack.
Figure 25:
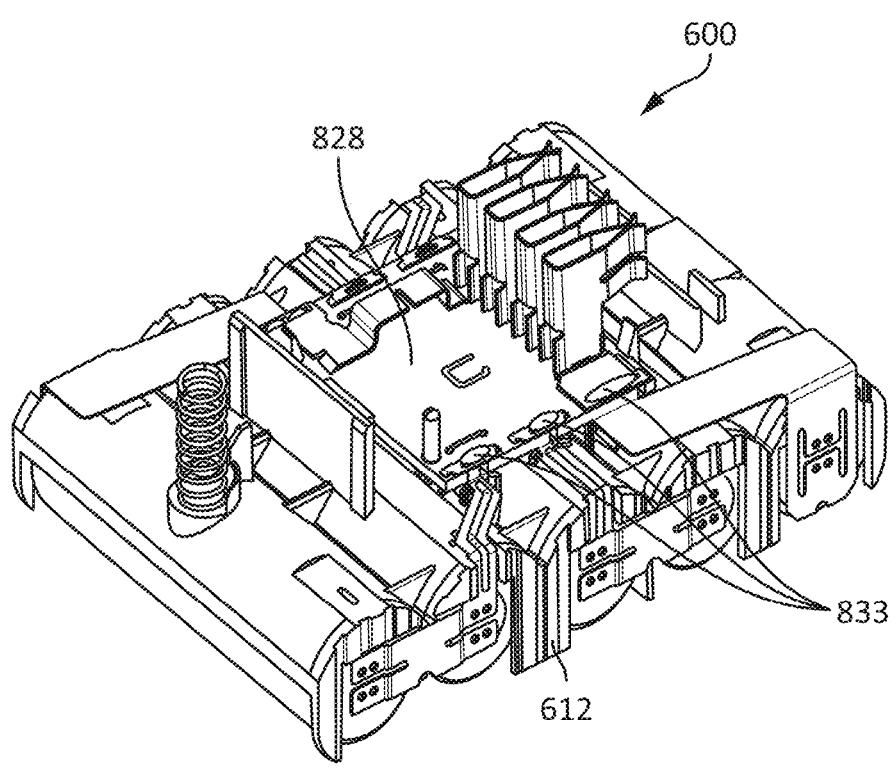
FIG. 25 is an isometric view of the corepack of FIG. 24.
Figure 26:
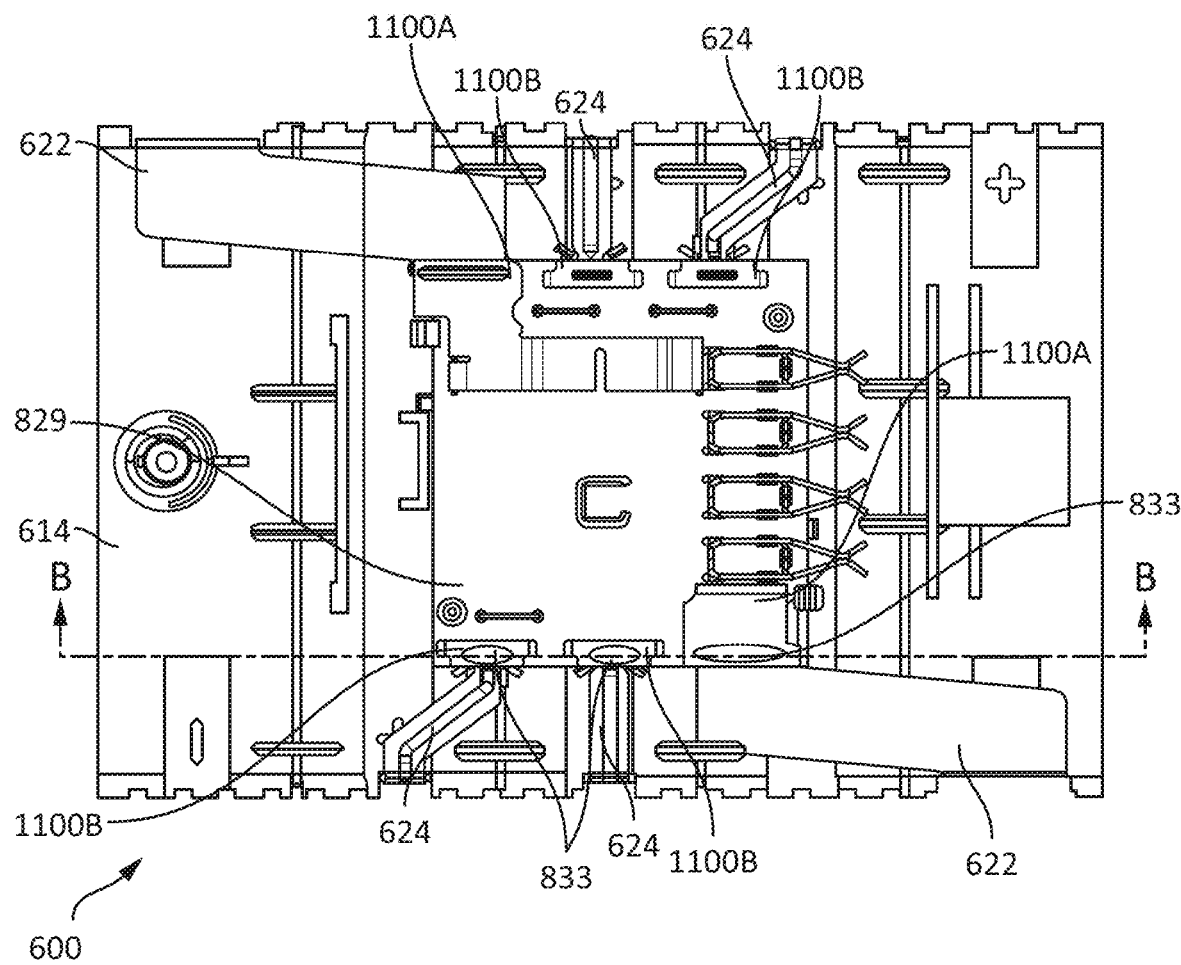
FIG. 26 is a top view of the corepack of FIG. 24.

As illustrated in FIGS. 24, 25, and 26, when the PCB module 828 is fully seated or combined with the battery 612 the corepack 600 is created. The PCB ends of the battery cell straps are received in the corresponding, associated battery strap through hole/cutout of the PCB and the through hole of the corresponding, associated strap contact. Once the PCB module 828 is fully seated with the battery 612, the PCB end of each battery strap is soldered 833 to the corresponding, associated strap contact. FIGS. 25 and 26 illustrate only three of the six battery cell straps soldered 833 to the corresponding, associated strap contacts. However, once the assembly process is complete, all of the battery cell straps will be soldered to the corresponding, associated strap contacts.

As illustrated in FIGS. 24-26, the PCB module 828 has been fulling combined with the battery 612 to create the corepack 600. The PCB end of the battery cell strap has been received—from the bottom side of the PCB—in the PCB via/hole/cutout and the strap hole of the strap contact and extends slightly beyond the strap contact. In this sense, the battery cell strap—particularly the PCB end of the battery cell strap—engages the strap contact.

Once the PCB module 828 and the battery 612 have been fully combined, the PCB end of the battery cell strap can be and is soldered 833 to the strap contact. FIGS. 24-26 illustrate some of the cell straps 622, 624 prior to being soldered to the strap contacts 1100 and some of the cell straps 622, 624 after being soldered to the strap contacts 1100. The battery cell straps 622, 624 may be connected to the strap contacts 1100 in other manners.

Once the cell straps 622 and 624 are connected to the strap contacts 1100A and 1100B, respectively, the electrically connection between the battery cells and the battery pack terminals and/or components mounted on the side of the PCB facing the battery cell holder (the bottom side of the PCB) is complete. This electrical circuit may include the battery cells, the battery cell straps (both power battery cell straps and sense battery cell straps), the strap contacts, traces on the bottom side of the PCB, and the battery pack terminals and/or the electrical/electronic components mounted to the bottom side of the PCB.

This process and technique enable the battery pack to be manufactured and assembled more efficiently, in part, by making all of the connections between terminals and components mounted on the PCB on a single side of the PCB thereby allowing the side of the PCB facing away from the battery cell holder (the top side) to be without any connection points that require working of the PCB. In other words, the process for creating the PCB of the PCB module does not require etching to take place on the top side of the PCB and therefore, no copper is wasted. This reduces the time and cost of producing the PCB module.

Figure 27:
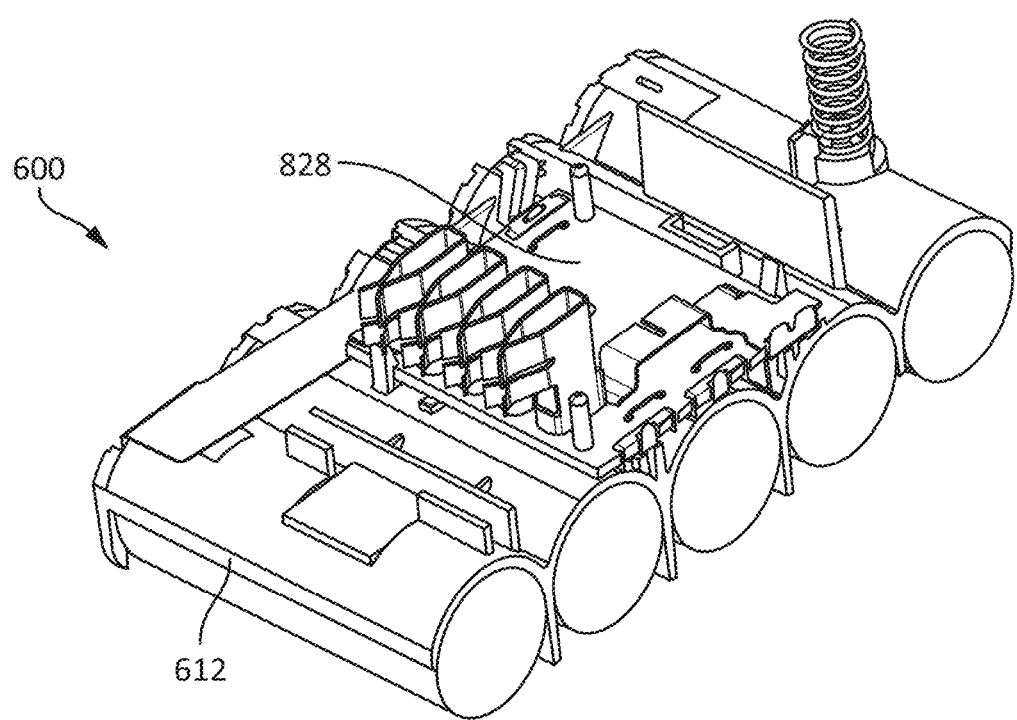
FIG. 27 is an isometric section view of the corepack taken along section line B-B of FIG. 26.
Figure 28:
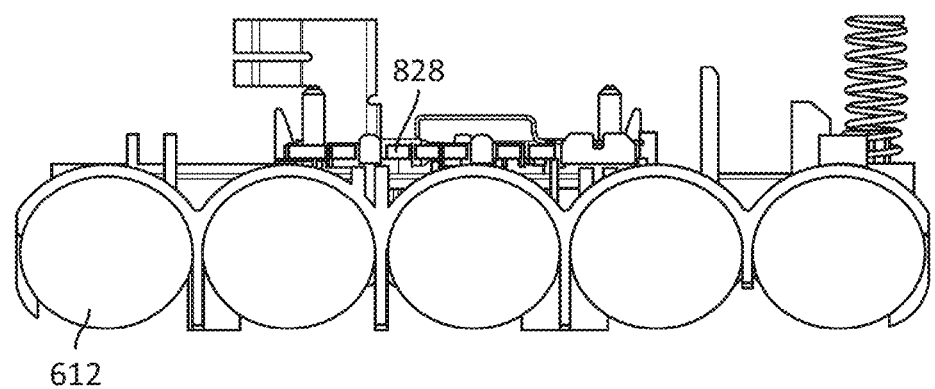
FIG. 28 is a side section view of the corepack taken along section line B-B of FIG. 26.

FIGS. 27 and 28 illustrate a cross section of the corepack. These figures illustrate the strap contacts coupling the battery straps to the battery pack terminals and/or components mounted on the bottom side of the PCB.

Figure 29:
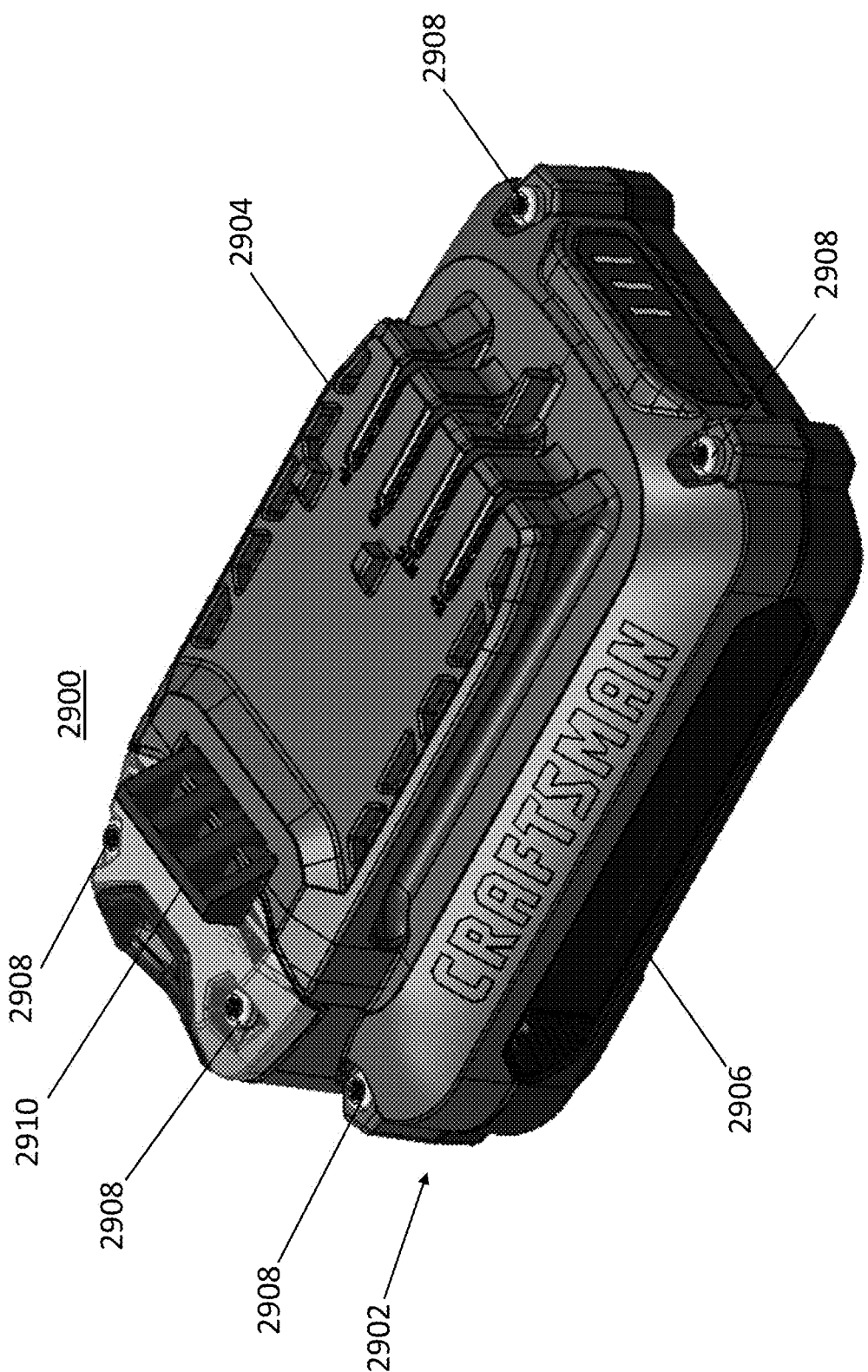
FIG. 29 is an isometric view of a battery pack.

FIG. 29 illustrates an isometric view of an example battery pack 2900. The battery pack 2900 includes a housing 2902. The housing 2902 includes top housing portion 2904 and a bottom housing portion 2906. The top housing portion 2904 and the bottom housing portion 2906 may be held together by one or more fasteners 2908, such as screws. The battery pack 2900 also may include a latch 2910 to mechanically couple the battery pack 2900 to cordless, battery operated power tools or other cordless, battery operated devices.

FIGS. 30-34 illustrate the assembly process for combining the components of the battery pack 2900 to form the completed battery pack 2900 as illustrated in both FIG. 29 and FIG. 34. The components illustrated in these figures are illustrated and discussed in more detail below in the individual component form. FIG. 30 illustrates an isometric view of a battery 3012, which is a component of the battery pack 2900 of FIG. 29. The battery 3012 includes a battery cell holder 3014 and multiple battery cells 3016. The battery cell holder 3014 holds the battery cells 3016 fixed in place relative to one another and fixed in place in the battery pack. The battery cell holder 3014 may include one or more pillars 3018 that are integrally formed as part of the battery cell holder 3014 and may be configured to hold a nut 3020, which is configured to receive a fastener. In some implementations, the pillars 3018 are configured to hold a hex nut 3020 securely such that the hex nut 3020 is held fixed in place within the pillar 3018 and is prevented from rotating. It is understood that the pillars 3018 may be configured to hold other types of nuts and that the hex nut is merely one example of a type of nut that may be securely held within the pillars 3018.

FIG. 31 illustrates an isometric view of the battery 3012 of FIG. 30 with multiple battery cell straps, including power battery cell straps 3022 and sense battery cell straps 3024, attached to the battery cells 3016. The assembly process includes attaching the power battery cell straps 3022 and the sense battery cell straps 3024 to the battery cells 3016. Similar to the battery cell straps discussed above, each of the battery cell straps 3022 and 3024 include a cell end and a PCB end. In this example, two power battery cell straps 3022 are used including a positive power battery cell strap 3022 with a cell end attached to a positive terminal of one of the battery cells at an end of the battery cell holder 3014 and a negative power battery cell strap 3022 with a cell end attached to a negative terminal of one of the battery cells at the other end of the battery cell holder 3014. The cell end of the positive power battery cell strap is connected to the positive terminal of the most positive battery cell in the string of battery cells and the cell end of the negative power battery cell strap is connected to the negative terminal of the most negative battery cell in the string of battery cells. Additional details with respect to the power battery cell straps 3022 are provided below.

In this example, four sense battery cell straps 3024 are used with each of the sense battery cell straps 3024 including a cell end and a PCB end. The cell end of the sense battery cell straps 3024 are connected to a positive terminal of a first battery cell 3016 and a negative terminal of a second battery cell 3016 thereby creating an electrical node between the first battery cell and the second battery cell. The PCB end of the sense battery cell straps 3024 may include a spring such as, for example a leaf spring, to make electrical and mechanical contact with an electrical trace on the PCB in a solderless manner. In this manner, no soldering needs to be used during the assembly process because the leaf spring on the PCB end of the sense battery cell straps 3024 makes the electrical and mechanical connections to the PCB without the use of solder. The sense battery cell straps 3024 are described in more detail below.

Once all of the battery cell straps 3022 and 3024 are connected to the battery cells 3016, a pack voltage is established between the positive power battery cell strap 3022 and the negative power battery cell strap 3022. The PCB end of the battery cell strap 3022 is connected to the cell end of the battery cell strap by a strap arm. The strap arm extends from the side of the battery cell holder 3014 to the top of the battery cell holder (side of the battery cell holder facing the PCB module). The PCB end of the battery cell strap 3022 extends from the top of the battery cell holder and, in some example implementations, includes a through hole 3026. The through hole 3026 on the PCB end of the battery cell strap 3022 is aligned over the pillar 3018 containing the nut 3020. The cell holder 3014 includes alignment posts 3125 to guide and align the assembly of a PCB onto the battery 3012 to form a corepack.

The assembly process continues as illustrated in FIG. 32. FIG. 32 is an isometric view of the battery 3012 of FIG. 30 and a printed circuit board module 3228 forming a corepack 3200. The PCB module 3228 includes the PCB 3229 having alignment holes 3230, battery pack terminals 3232, and fuses 3234 and 3236. The alignment holes 3230 are sized and configured to receive the alignment posts 3125. The battery pack terminals 3232 may be mounted and disposed on the PCB 3229, as described above. In this example implementation, the PCB module 3228 does not include strap contacts like the implementations described above. Instead, the sense battery cell straps 3024 having the leaf spring make direct contact with a side of the PCB 3229 facing the battery cells without the use of strap contacts. In this manner, any soldering that was needed to make an electrical connection between the sense battery cell straps 3024 and electrical traces on the PCB 3229 are eliminated. The electrical contact is made using the leaf spring without any soldering. The fuses 3234 and 3236 may be made of a conductive material (e.g., metal) and are configured to provide a conduit for electrical signals from the power battery cell straps 3022 to the battery pack terminals 3232. The fuses 3234 and 3236 include through holes that align with the through holes 3026 on the power battery cell straps 3022 and corresponding through holes on the PCB 3229.

In this example implementation, fasteners 3240 (e.g., screws) are used to make an electrical and mechanical connection between the PCB module 3228 and the battery using the power battery cell straps 3022. The screws 3240 are inserted into the through holes on the fuses 3234 and 3236 and the underlying through holes on the PCB and the through holes 3026 on the power battery cell straps 3022 and fastened into the nuts 3020 in the pillars 3018. One screw 3240 mechanically and electrically connects the power battery cell strap 3022 attached to the positive terminal of the battery cell 3016 to the fuse 3234 and one end of the battery pack terminals 3232. The other screw 3240 mechanically and electrically connects the power battery cell strap 3022 attached to the negative terminal of the battery cell 3016 to the fuse 3236 and the other end of the battery pack terminals 3232. The use of the screws 3240 to mechanically and electrically couple the PCB module 3228 to the power battery cell straps 3022 eliminates the need for soldering at these locations during the assembly process of the corepack 3200, which has the advantage of increasing the efficiency and speed of the assembly process.

Once the corepack 3200 is assembled, the corepack 3200 is inserted into the bottom housing portion 2906. FIG. 33 illustrates an isometric view of the corepack 3200 of FIG. 32 inserted in a lower housing of the battery pack of FIG. 29. The assembly process of the battery pack 2900 is completed as illustrated in FIG. 34. FIG. 34 is an isometric view of the battery pack of FIG. 29 with a top housing portion 2904 of the battery pack 2900 secured to the bottom housing portion 2906 of the battery pack using the fasteners 2908.

Figure 35:
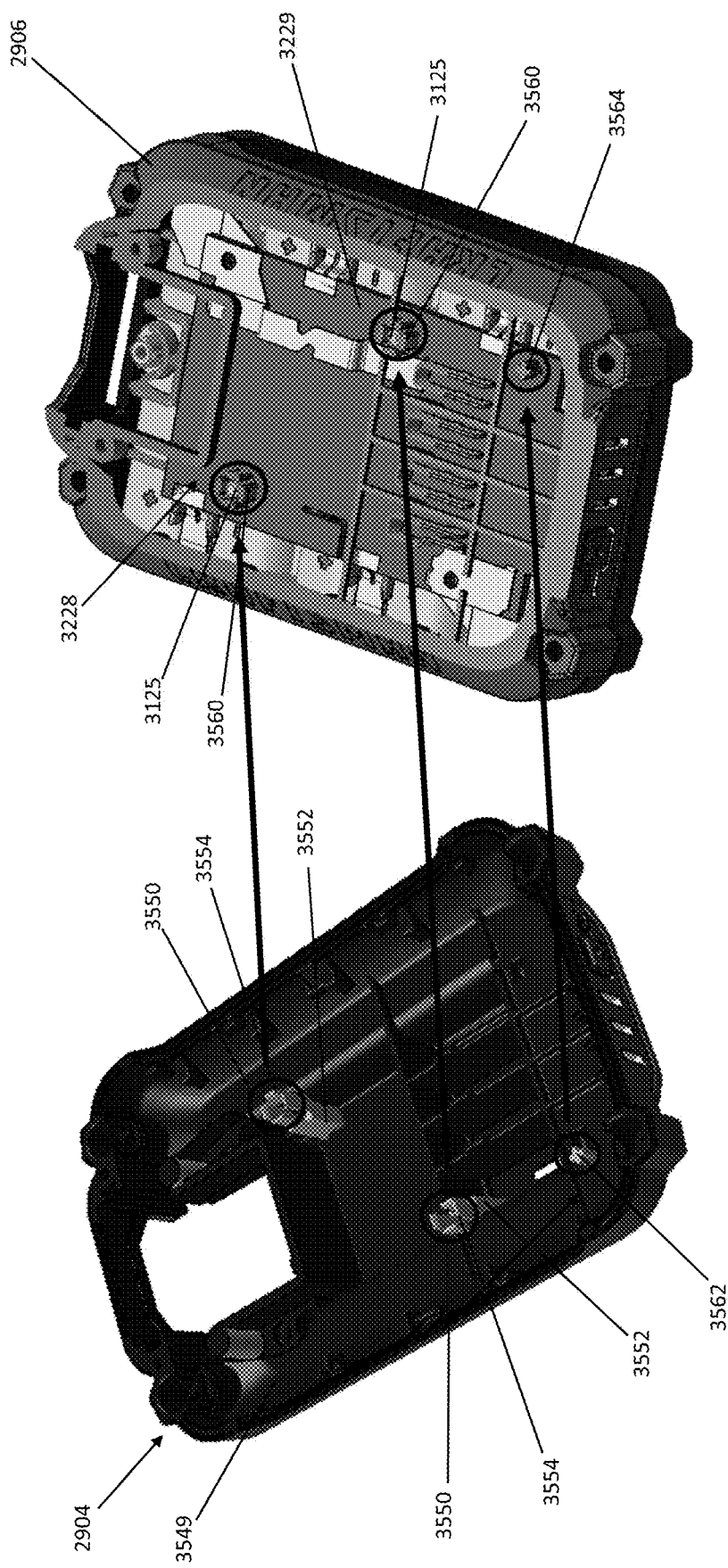
FIG. 35 is an isometric view of an inside of a top housing portion of the battery pack and the bottom housing portion of the battery pack.

FIG. 35 illustrates an isometric view of an inside 3549 of the top housing portion 2904 of the battery pack 2900 and the bottom housing portion of the battery pack. In some implementations, as illustrated in FIG. 35, the inside 3549 of the top housing portion 2904 may include one or more hold-down structures to further secure the PCB module 3228 within the battery pack to lessen movement and vibration of the PCB module 3228 during use of the battery pack with a power tool. The top housing portion 2904 may include alignment receivers 3550 that are configured to receive and hold the alignment posts 3125 and four tabs 3560 that surround the alignment posts 3125. The alignment posts 3125 project through the alignment holes on the PCB module 3228. The four tabs 3560 surrounding the alignment posts 3125 may be disposed on the PCB 3229 and project perpendicular to the plane of the PCB 3229. The alignment receivers 3550 include a post 3552 and four flexible tabs 3554 on top of the post 3552. The post 3552 is secured to the inside 3549 cover of the top housing portion 2904 and extends perpendicular from a horizontal plane on the inside 3549 cover of the top housing portion 2904. The flexible tabs 3554 form an opening at the unsecured end of the alignment receiver 3550, where the opening is configured to receive and hold the alignment post 3125 and the four tabs 3560. The opening may be smaller in size than a top of the alignment posts and the four tabs 3560 such that the alignment post 3125 and four tabs 3560 tightly fit into the opening by pressing the flexible tabs 3554 slightly outwards. The spring tension of the flexible tabs 3554 hold the alignment post 3125 and the four tabs 3560 in place and may secure and hold down the PCB module 3228 within the top housing portion 2904.

Additionally, the inside 3549 of the top housing portion 2904 may include a cross-shaped post 3562 that aligns with a corresponding cross-shaped post 3564 projecting from the PCB module 3228. The top of the cross-shaped post 3562 may align with the top of the cross-shaped post 3564 to further hold down and secure the PCB module 3228 within the top housing portion 2904. It is understood that posts having shapes other than cross-shaped (e.g., circular, square, rectangular, etc.) may be used.

Figure 37:
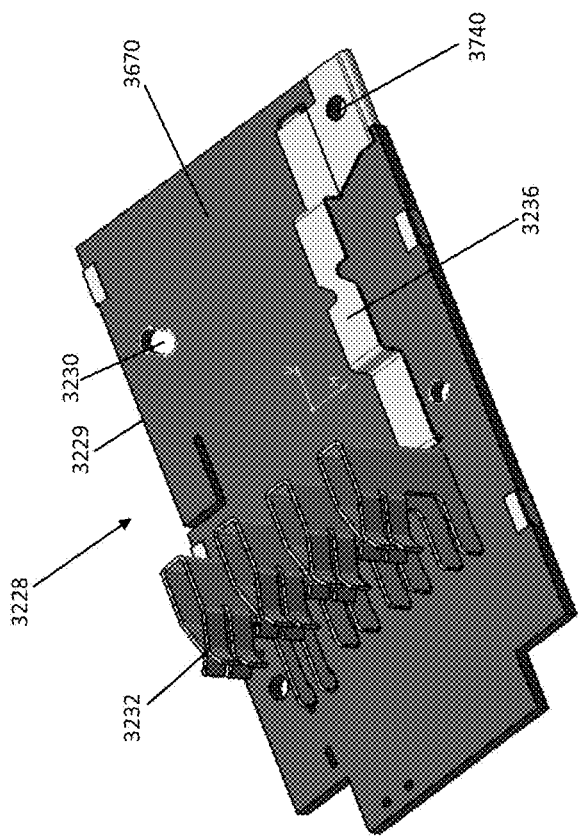
FIG. 37 is an isometric view of a top side of the printed circuit board module of FIG. 32.
Figure 36:
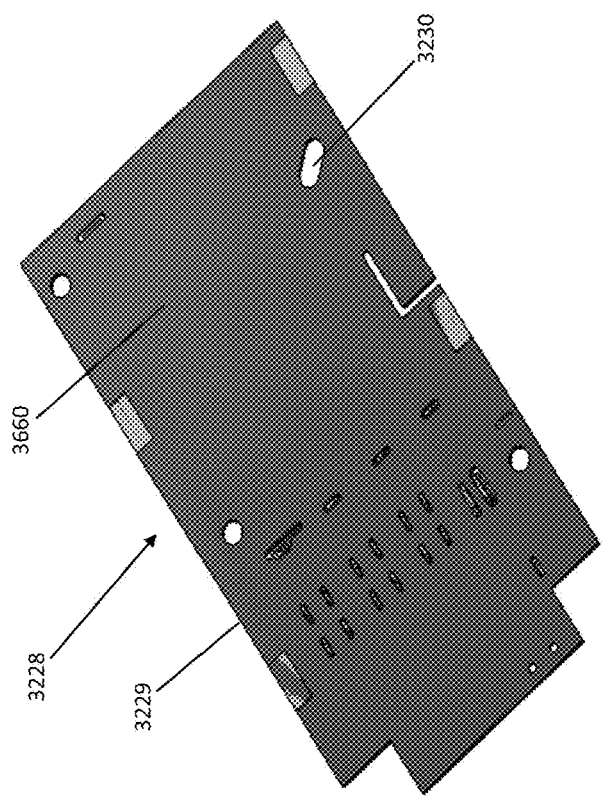
FIG. 36 is an isometric view of a bottom side of the printed circuit board module of FIG. 32.

FIGS. 36 and 37 illustrate the printed circuit board module 3228 of FIG. 32. FIG. 36 illustrates an isometric view of a bottom side 3660 of the printed circuit board module 3228 of FIG. 32, where the bottom side 3660 refers to the side facing the battery cell holder. FIG. 37 illustrates an isometric view of a top side 3670 of the printed circuit board module 3228 of FIG. 32, where the top side 3670 refers to the side facing an inside of the top housing portion. The bottom side 3660 of the printed circuit board module includes one or more components (not shown) and one or more electrical traces (not shown). The battery pack terminals 3232 extend through terminal opening on the PCB 3229 and are soldered or otherwise mounted to the bottom side 3660. The top side 3670 of the PCB module 3228 includes the battery pack terminals 3232 disposed on the PCB 3229, alignment holes 3230 and fuses 3234 (not visible in this view) and 3236. As seen in this view, the fuse 3236 includes a through hole 3740 through which the screws 3240 are inserted. In this example, components and electrical traces are not included on the top side 3670.

Figure 39:
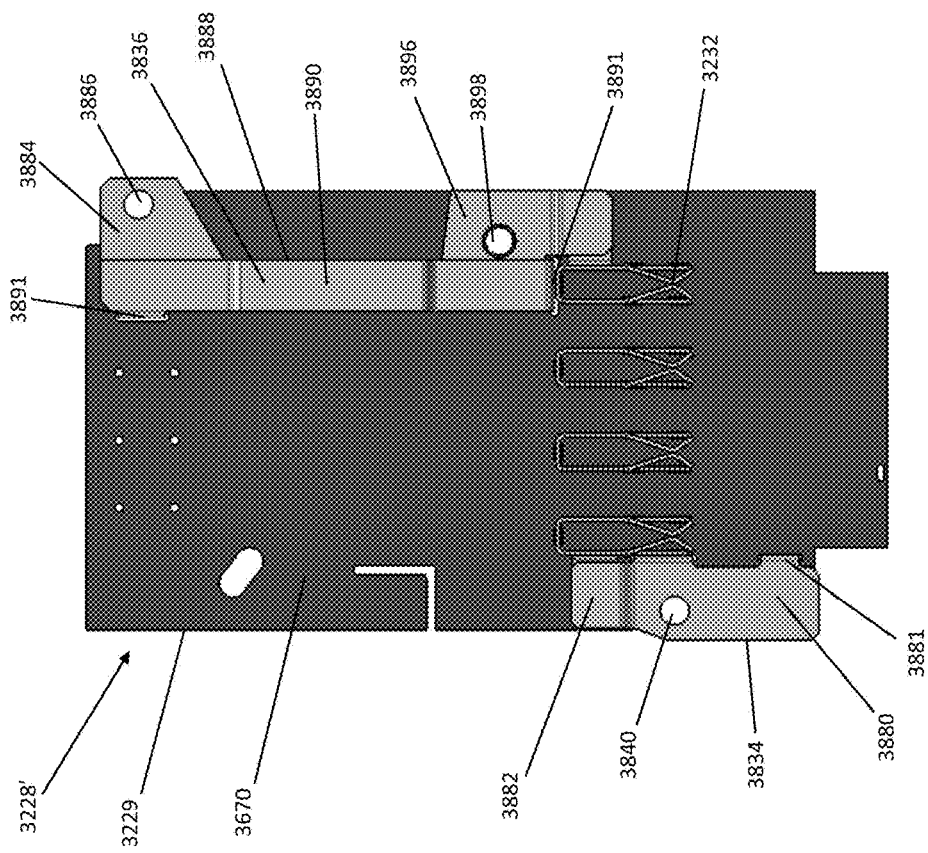
FIG. 39 is a top view of the printed circuit board module of FIG. 38.
Figure 38:
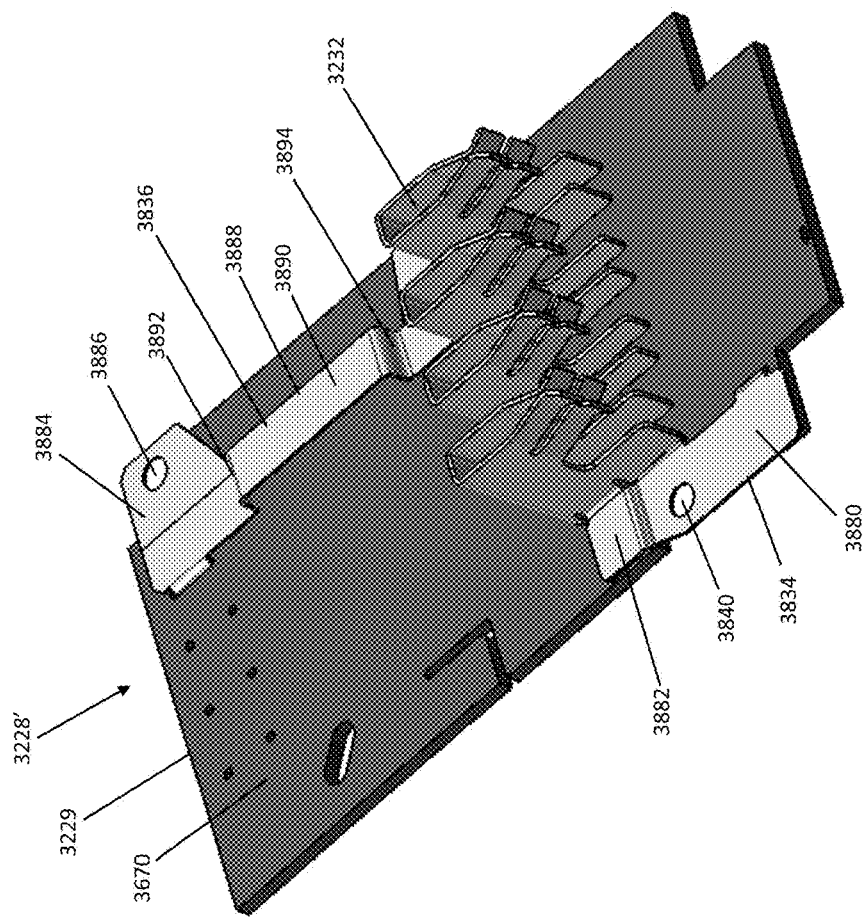
FIG. 38 is an isometric view of top side of a printed circuit board module.

FIGS. 38 and 39 illustrate an example PCB module 3228', where FIG. 38 illustrates an isometric view of top side 3670 of a printed circuit board 3229 and FIG. 39 illustrates a top view of the printed circuit board module 3228' of FIG. 38. In this example, the printed circuit board module 3228' is similar to the printed circuit board module 3228 except that printed circuit board module 3228' includes slightly different fuses 3834 and 3836. The printed circuit board module 3228' includes the same PCB 3229 and the same battery pack terminals 3232 as the printed circuit board module 3228. The fuse 3834 includes a flat, elongated body 3880 and a raised tab portion 3882 integrally formed with the body 3880. The body 3880 includes a through hole 3840 to receive a screw to make an electrical connection between the power battery cell strap, the fuse 3834, and the battery pack terminals 3232. The body 3880 also may include through tabs 3881 that extend through the PCB 3229 to secure the fuse 3834 to the PCB 3229.

The fuse 3836 includes a first tab 3884 having a through hole 3886, an arm 3888 having a center portion 3890 with two legs 3892, 3894 extending from the arm 3888, and a second tab 3896 having a through hole 3898. The first tab 3884, the arm 3888, and the second tab 3896 may be integrally formed. The second tab 3896 is electrically connected to the battery pack terminals 3232. The through hole 3886 is configured to receive a screw to make an electrical and mechanical connection with the power battery cell strap. The through hole 3898 may be configured to receive a post disposed on the battery cell holder to assist in aligning and securing the PCB 3229 when assembled with the battery. Each end of the arm 3888 also may include through tabs 3891 that extend through openings in the PCB 3229. In the assembly process FIGS. 30-34, the printed circuit board module 3228 was combined with the other components to form the battery pack. In the Figures discussed below, the printed circuit board module 3228' is combined with the with the other components to form the battery pack.

Figure 40:
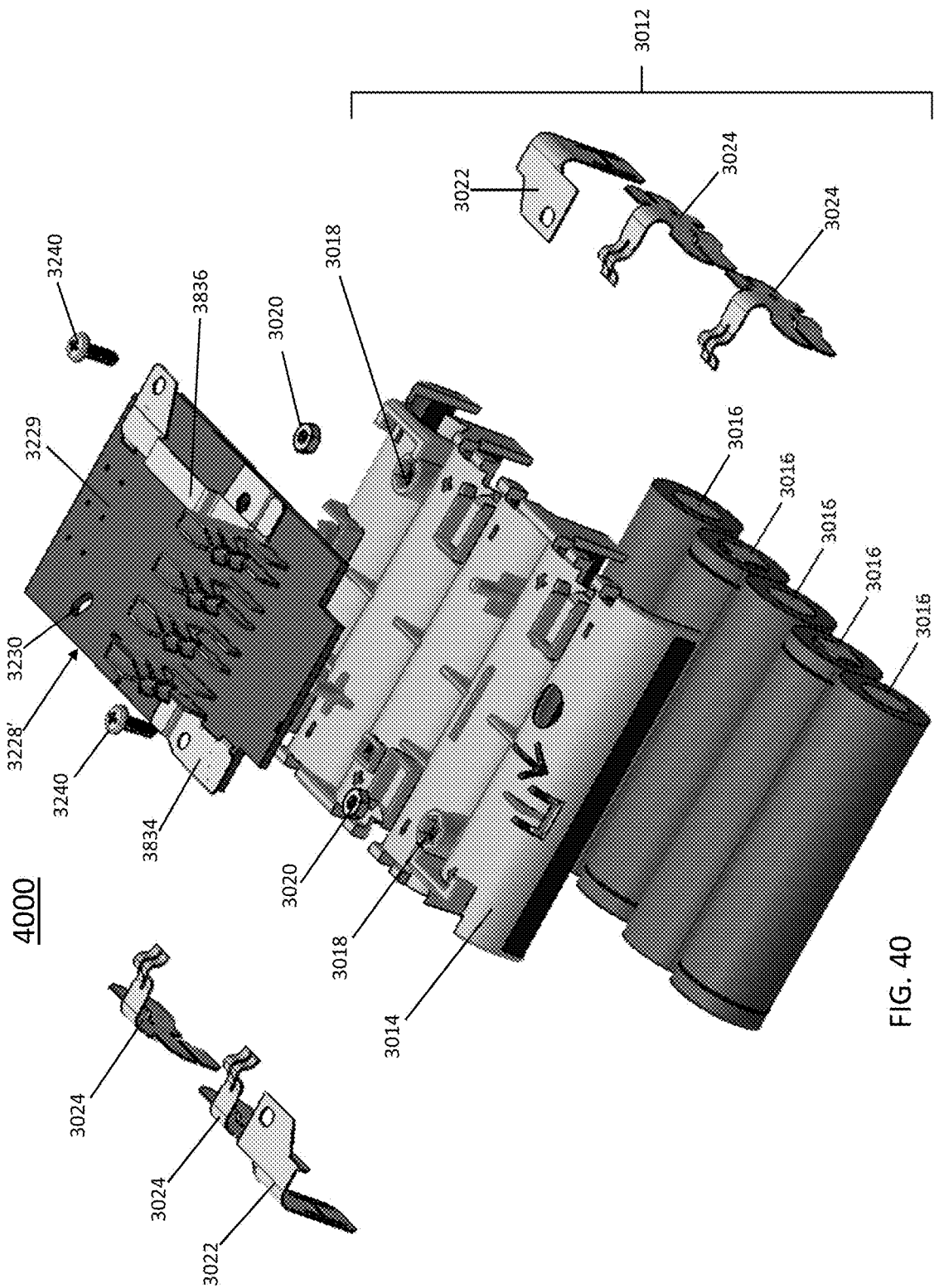
FIG. 40 is an exploded view of an example embodiment of a corepack.
Figure 43:
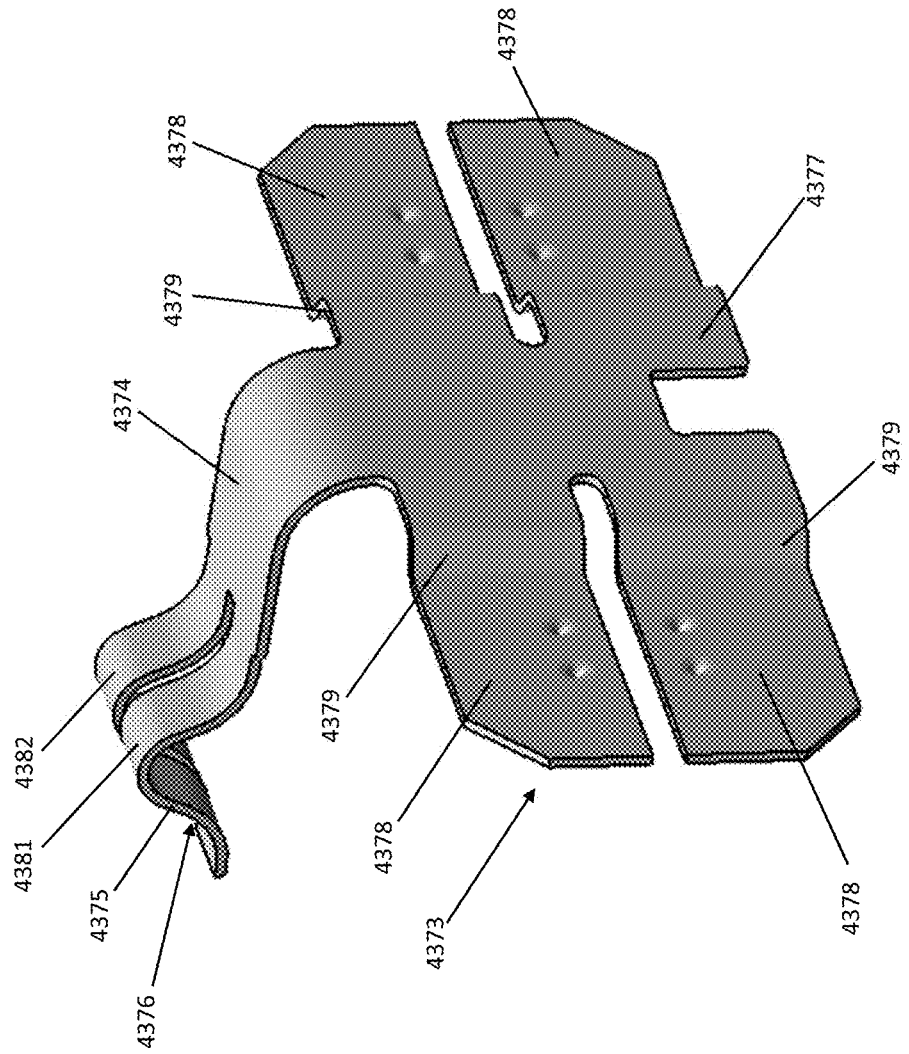
FIG. 43 is an isometric view of a sense battery cell strap.
Figure 44:
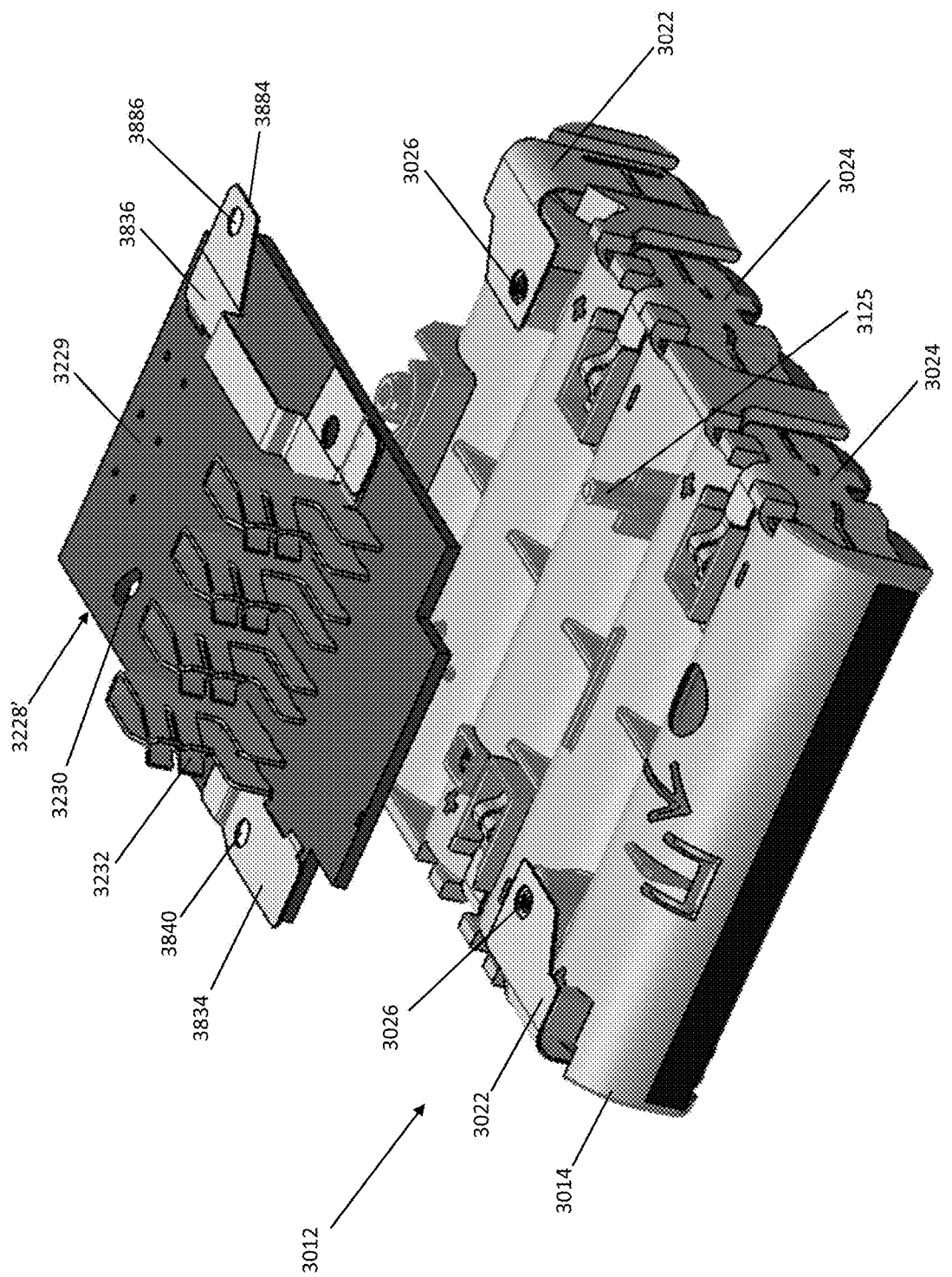
FIG. 44 is an exploded view of the battery and the PCB module of the corepack of FIG. 40.
Figure 46:
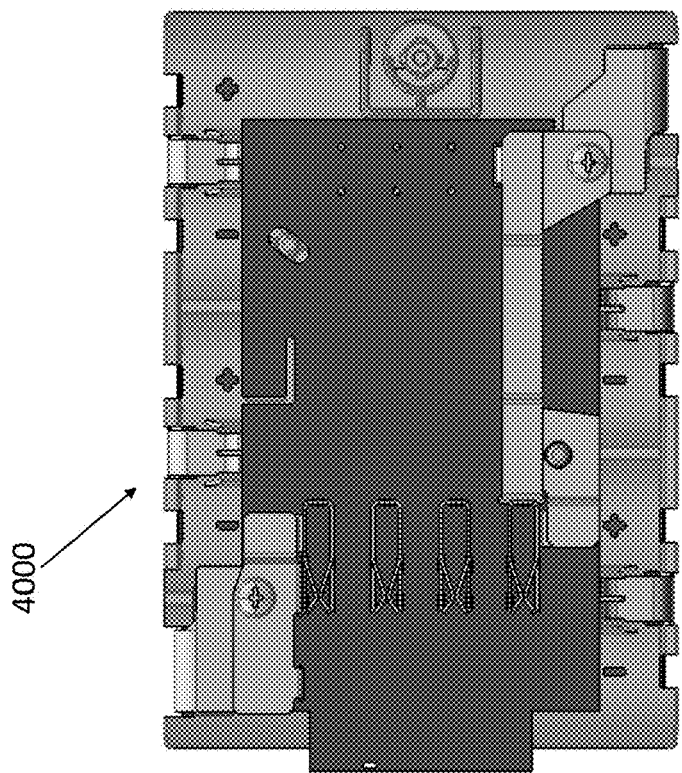
FIG. 46 is a top view of the corepack of FIG. 40.
Figure 45:
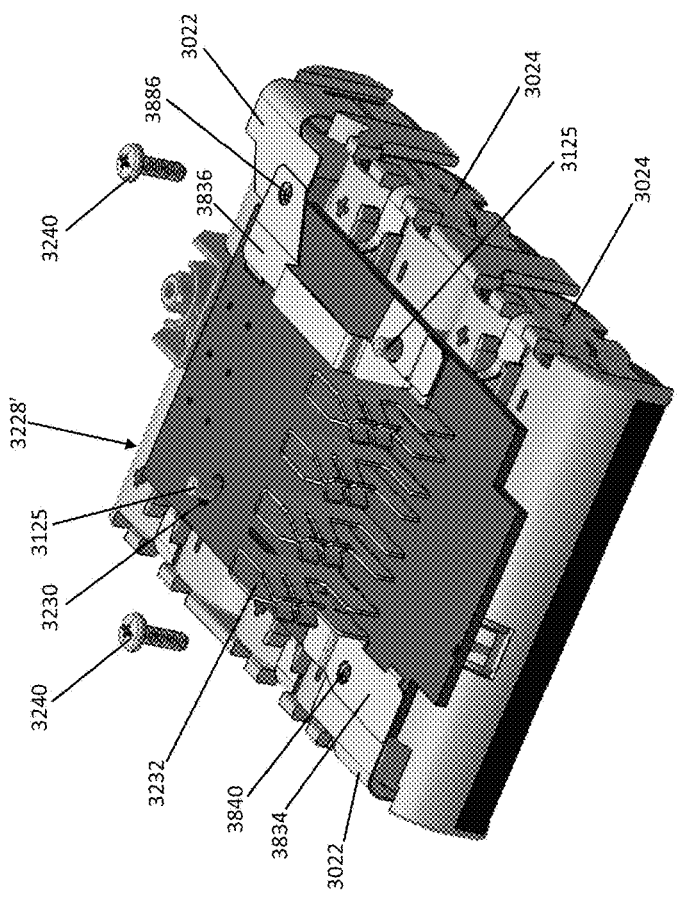
FIG. 45 is an isometric, assembled view of the corepack of FIG. 40.

FIGS. 40-46 illustrate an example embodiment of a corepack 4000 using the techniques and components described above. FIG. 40 illustrates an exploded view of a corepack 4000. FIGS. 41-44 illustrate the components of the corepack 4000 and FIGS. 45 and 46 illustrate the assembled corepack 4000. In this example embodiment, like the example embodiment of FIGS. 30-34, no solder is used to assemble the corepack 4000. The only solder used in the corepack 4000 may be on a bottom side of the PCB to secure components to the bottom side of the PCB, which may be done prior to the assembly process. The battery cell straps, including the power battery cell straps and the sense battery cell straps, make mechanical and/or electrical connections without the use of solder. Specifically, fasteners (e.g., screws and nuts) are used to mechanically and electrically connect the PCB, fuse, and power battery cell strap using a screw on top and the nut inserted in the plastic pillar of the battery cell holder. The sense cell strap includes a leaf spring with multiple contact points to make contact with copper pads on the PCB to create an electrical and mechanical interface. These features are illustrated by FIGS. 40-46.

The corepack 4000 includes a battery 3012 and a PCB module 3228'. The battery 3012 is a same component as the battery 3012 of FIGS. 30-34. That is, the battery 3012 includes the battery cells 3016, the battery cell holder 3014 and the battery cell straps 3022 and 3024. The PCB module 3228' is a same component as the PCB module 3228' of FIGS. 38 and 39, where the fuses 3834 and 3836 are different than the fuses 3234 and 3236 of FIG. 32.

Figure 41:
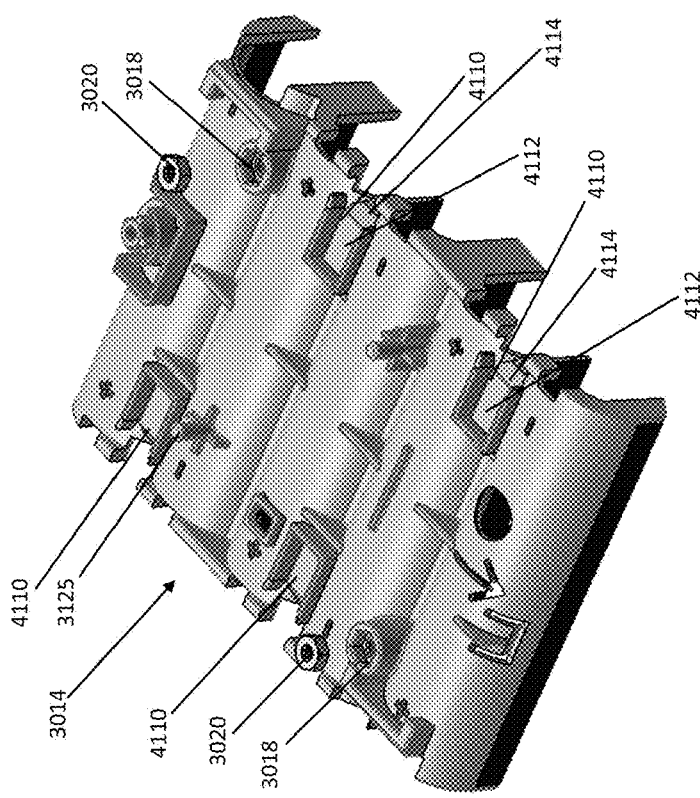
FIG. 41 is an isometric view of the battery cell holder of the corepack of FIG. 40.

As discussed above, the cell holder 3014 holds the battery cells 3016 in a fixed position relative to one another and in a fixed position within the cell holder 3014. The cell holder 3014 multiple pillars 3018 configured to receive and hold the nuts (e.g., hex nuts) 3020. The cell holder 3014 also includes alignment posts 3125 to align the with the alignment holes 3230 on the PCB 3229. FIG. 41 illustrates support ribs 4110 that provide support and leverage for the leaf springs 4375 of the sense battery cell straps 3024, as illustrated in more detail in FIG. 43. The support ribs 4110 may include a flat surface 4112 connected to an angled surface 4114. The support ribs 4110 may be integrally formed with the cell holder 3014.

Figure 42:
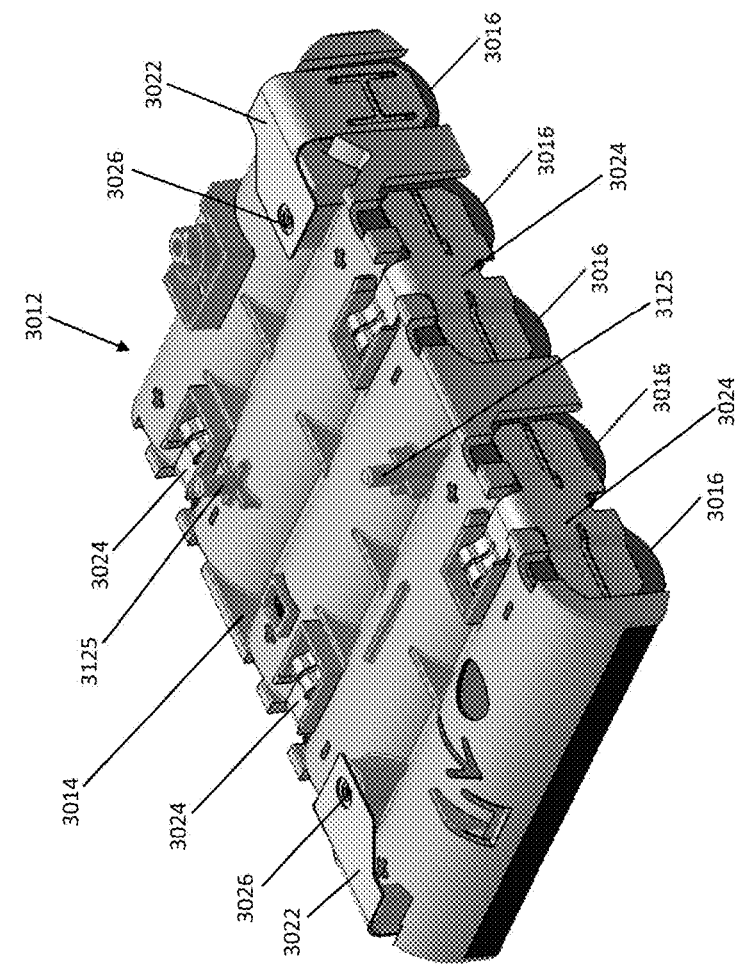
FIG. 42 is an isometric view of the battery of the corepack of FIG. 40.

The assembled battery 3012 illustrated in FIG. 42 includes the battery cells 3016 inserted into the cell holder 3014. The two power battery cell straps 3022 are each connected to one of the battery cells 3016 at the cell end of the power battery cell strap, as discussed in detail above. In this example implementation, the power battery cell straps 3022 include a through hole 3026, which aligns with the opening of the pillars 3018 to enable the inserted screws 3240 access to the nuts 3020, which are inserted into the pillars 3018. In some implementations, the nuts 3020 may be zinc-plated, steel hex nuts. In other example implementations discussed below, other mechanical and electrical connecting techniques (e.g., laser welding) may be used that do not involve the use of the screws. In those example implementations, the power battery cell straps 3022 may or may not include the through hole 3026.

FIG. 42 also illustrates the four sense battery cell straps 3024 with a cell end 4373 connected to respective battery cells 3016. FIG. 43 illustrates an example sense battery cell strap 3024. The sense battery cell strap 3024 includes a cell end 4373 and a PCB end 4376 connected by a curved arm 4374. The cell end 4373 includes a center portion 4377 and four tabs 4378 with the tabs 4378 connecting to the battery cells 3016. The tabs 4378 extend from the center portion 4377 through an angle portion 4379. The angle portion 4379 extends the tabs 4378 vertically away from the center portion 4377 such that the flat tabs 4378 and the flat center portion 4377 are parallel to each other on different horizontal planes. The curved arm 4374 extends from a top of the center portion 4377 and provides a curved surface to enable the cell end 4376 to wrap around the cell holder 3014 such that the cell end 4376, including the leaf spring 4375, can interface with the support ribs 4110 on the cell holder 3014. The leaf spring 4375 enables electrical and mechanical contact to be made with copper pads connected to electrical traces on a bottom side of the PCB 3229. The leaf spring 4375 includes a first contact point 4381 and a second contact point 4382 that are spaced apart. The two contact points 4381 and 4382 provide multiple electrical interfaces between the sense battery cell strap 3024 and the contact point on the PCB 3229. In some implementations, the two contact points 4381 and 4382 are spaced apart by approximately 0.1 mm.

In some implementations, a lubricant grease is applied to the top of the leaf spring 4375 to enable the grease to lubricate between the leaf springs 4375 and copper pads on the bottom side of the PCB 3229. In addition to the lubricant features, the grease may provide other benefits including acting as a preventative against contamination, as well as deoxidizing and protecting the surfaces as they interface with each other.

As illustrated in FIG. 44, the printed circuit board module 3228' is aligned using the alignment holes 3230 and the alignment posts 3125. The printed circuit board module 3228' includes the PCB 3229 having a bottom side with the components and electrical traces and copper pads facing the top of the cell holder 3014. The printed circuit board module 3228' includes the fuses 3834 and 3836 and the battery terminals 3232. The through hole 3886 on the first tab 3884 of the fuse 3836 aligns with the through hole 3026. The through hole 3840 on the fuse 3834 aligns with the through hole 3026. As illustrated in FIGS. 45 and 46, the screws 3240 are inserted into the through hole 3886 and secured into the nut 3020 to make an electrical and mechanical connection between the PCB 3229, the fuses 3834 and 3836, and the power battery cells straps 3022. The copper pads on the bottom side of the PCB 3228 make electrical and mechanical connections with the leaf springs 4375 on the sense battery cell straps 3024. The sense battery cell straps 3024 provide the advantages of ease of manufacturing, ease of assembly, and the elimination of solder. The power battery cell straps 3022 using the screws and nuts provide the advantages of ease of manufacturing, easy and reliable assembly, and easy to inspect for proper assembly.

Figure 47:
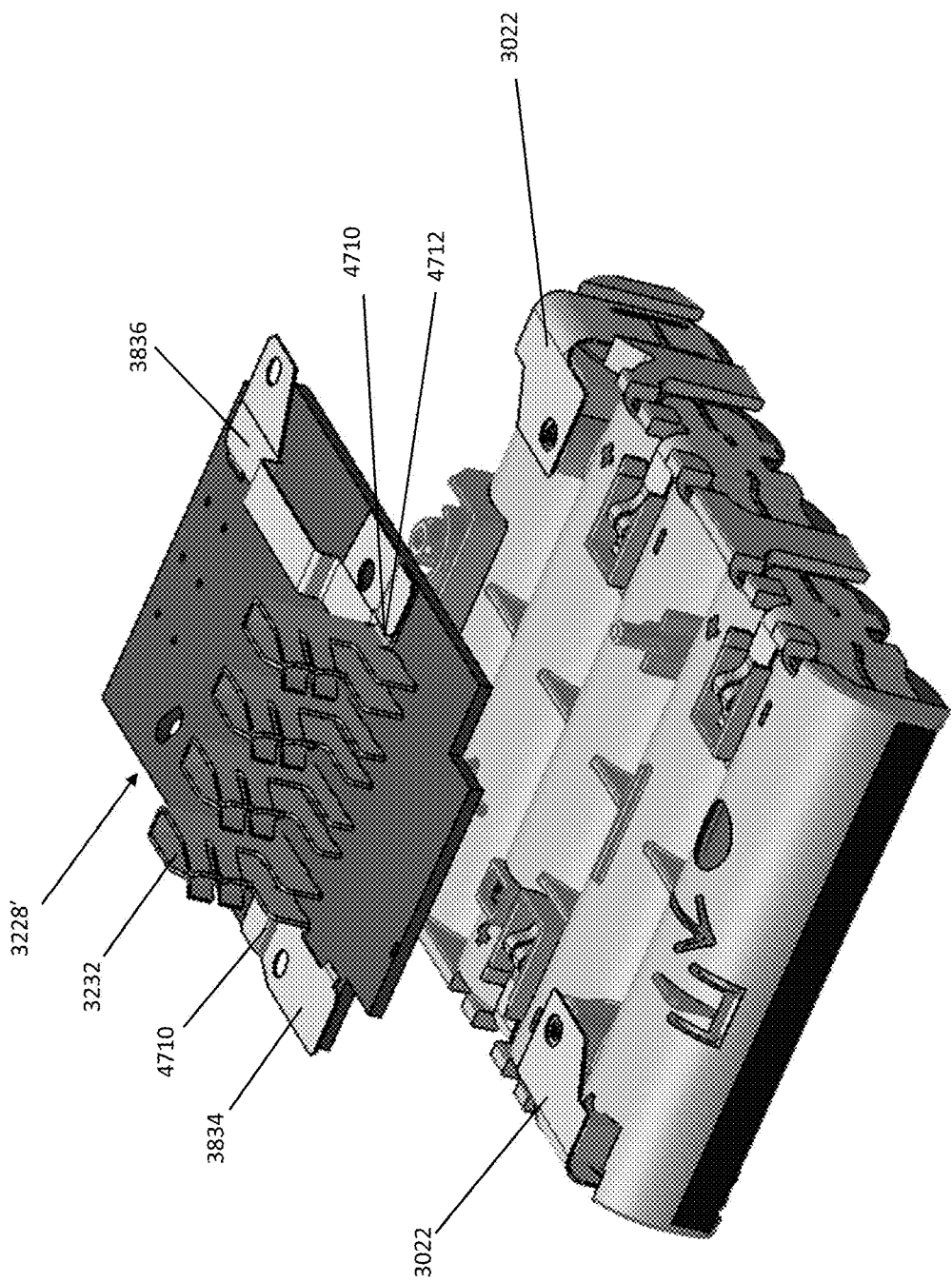
FIG. 47 is an exploded view of the battery and PCB module of the corepack of FIG. 40 assembled using an alternative example process.

In some implementations, other connection techniques may be used to on the power battery cell straps 3022 other than screws and nuts. FIG. 47 is an exploded view of the battery and PCB module of the corepack of FIG. 40 assembled using an alternative example process. In this example implementation, the PCB module 3228' and the battery 3012 are assembled into the corepack using a welding technique such as, for example, laser welding or resistance welding. The same components, other than the screws 3240 and the nuts 3020, are used as in the example implementation described above with respect to FIGS. 40-46. Laser or resistance welding is used to make an electrical and mechanical connection between the power battery cell straps 3022 and the fuses 3834 and 3836. This has the advantage of eliminating additional parts (e.g., the screws and nuts), thus saving component costs. Additionally, laser or resistance welding may be used at the ends of the fuses 3834 and 3836 that connect to the battery cell terminals 3232, as indicated in FIG. 47 at point 4710. Welding at points 4710 provides an advantage in some battery packs to lower the resistance path and have less current flow through the PCB and solder joints on the bottom side of the PCB. The battery pack terminals 3232 may include a wing portion 4712 that flares out from the terminal and tucks under the end of the fuse 3836 (and 3834). The provides an overlap of material between the battery pack terminals 3232 and the fuses 3834 and 3836 creating a weld location for welding by laser or resistance welding (or other types of welding). Even in the implementation described above with respect to FIGS. 40-46 using the screws and nuts, laser or resistance welding may be used at point 4710 to electrically and mechanically connect the fuses 3834 and 3836 to the wing 4712 on the battery cell terminals 3232.

Figure 49:
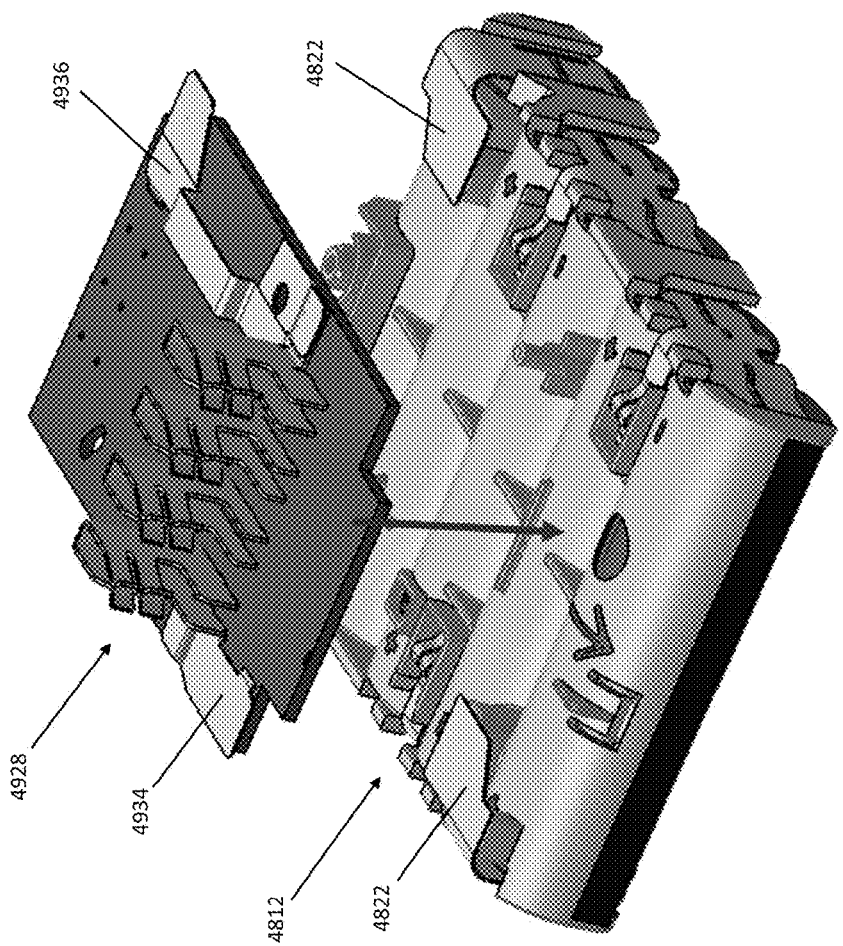
FIG. 49 is an exploded view of the battery and a PCB module according to the example embodiment of FIG. 48.
Figure 48:
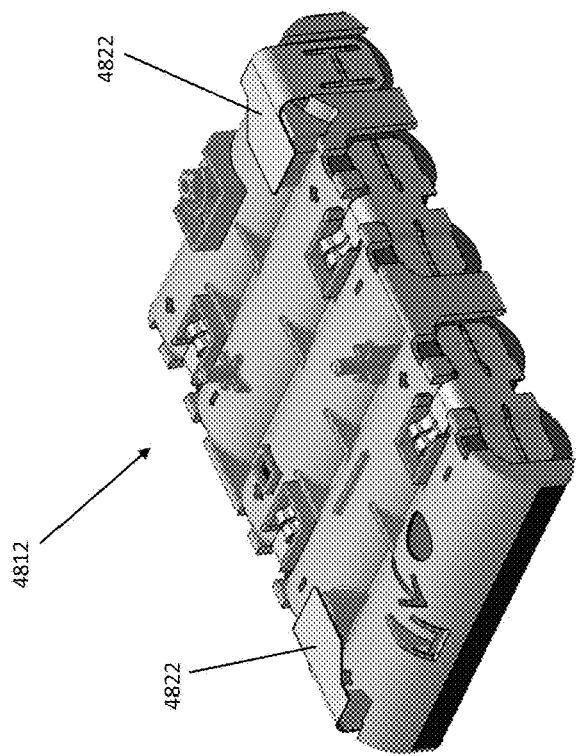
FIG. 48 is an isometric view of a battery in another example embodiment.
Figure 50:
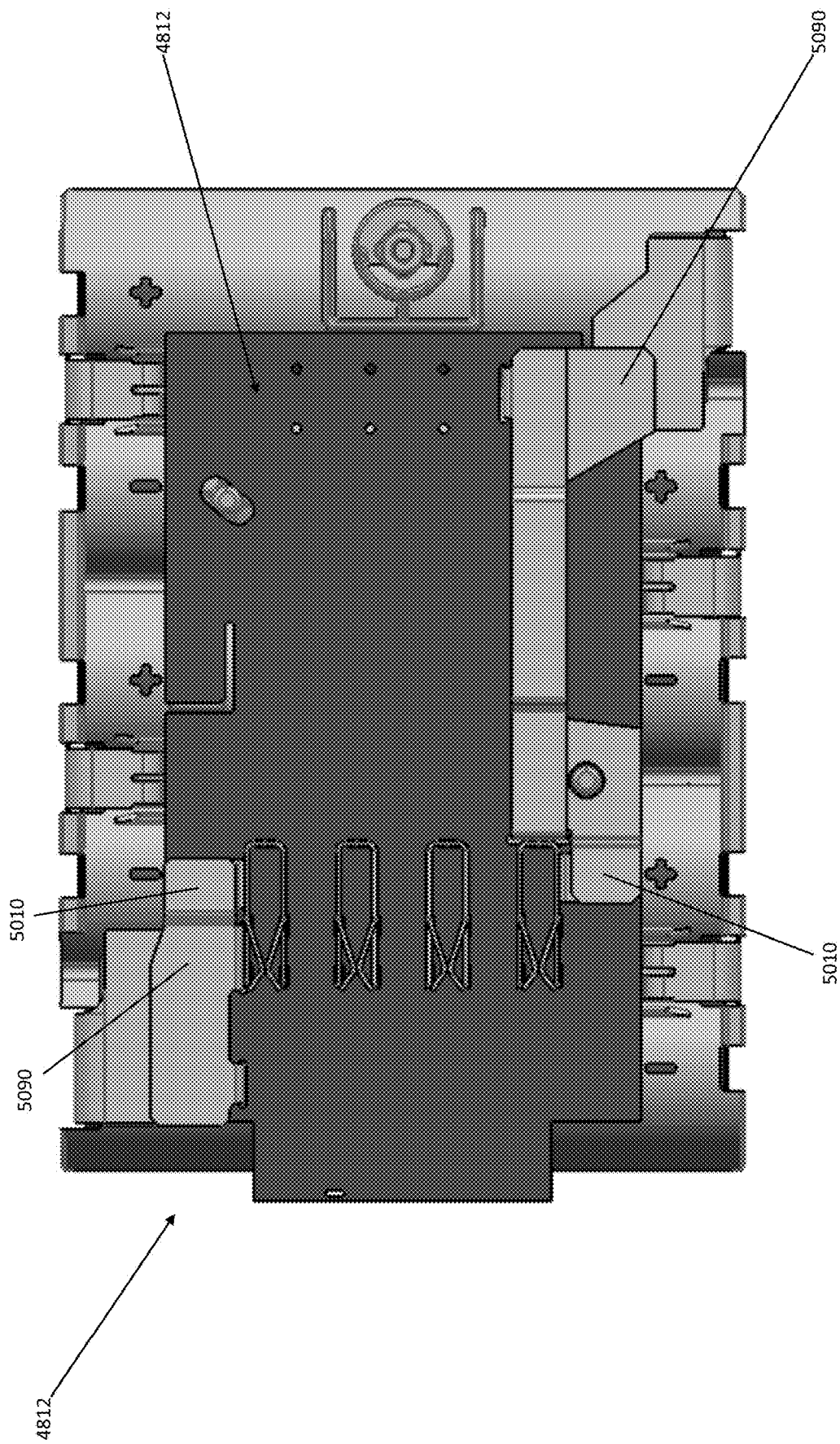
FIG. 50 is a top view of an assembled corepack of the battery and PCB module of FIGS. 48 and 49.
Figure 51:
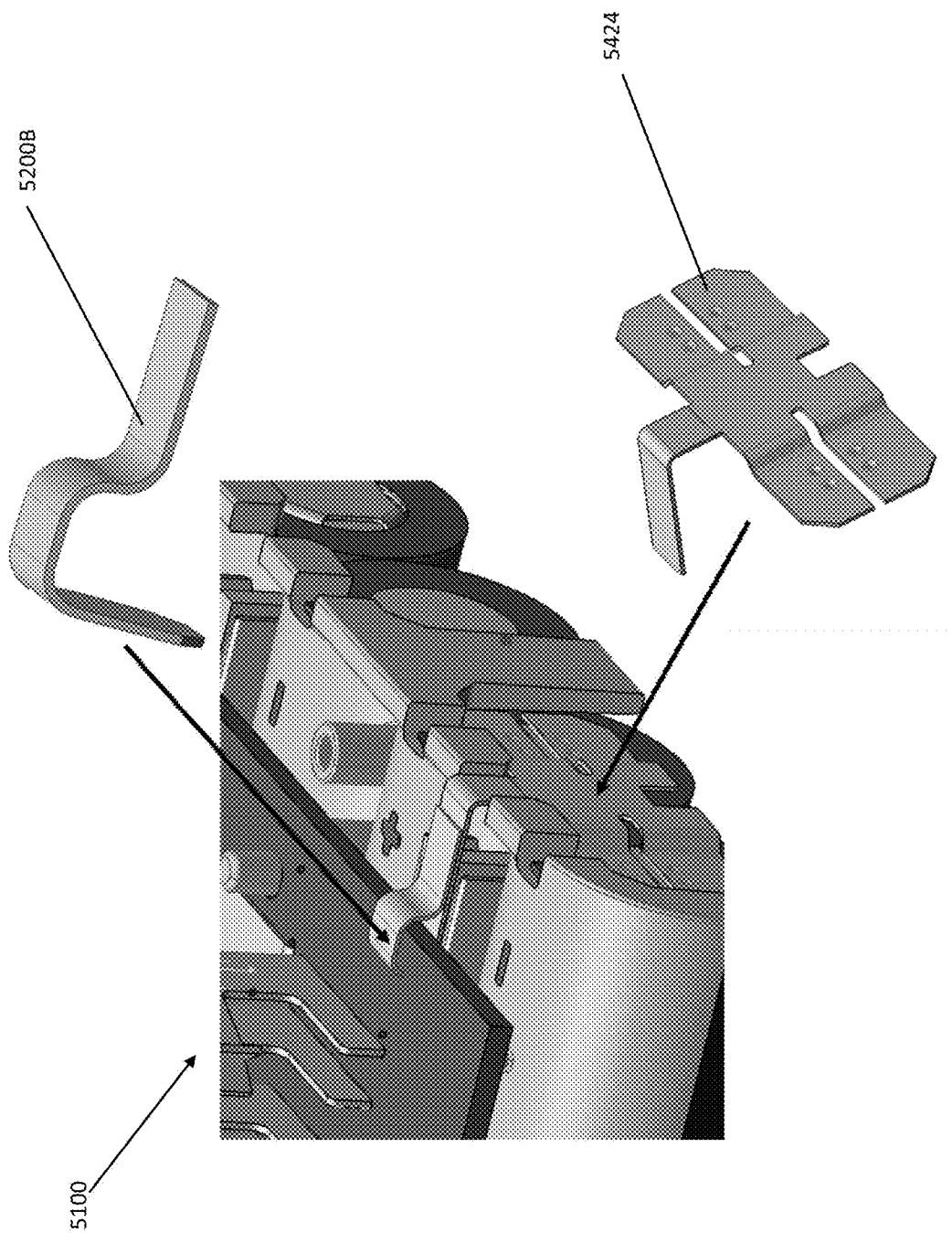
FIG. 51 is a isometric view of a partial corepack using a module strap and a battery cell strap in the assembly of the corepack according to another example embodiment.

In some implementations, the battery and the PCB module include components without through holes because laser or resistance welding techniques are used instead of screws and nuts to make electrical and mechanical connections between the fuses on the PCB module and the power battery cell straps on the battery. FIGS. 48-50 illustrate these components without through holes to accommodate laser and resistance welding techniques. The battery 4812 includes the same components as the battery 3012 of FIG. 42 except the power battery cell straps 4822 do not include through holes since screws and nuts are not being used. The sense battery cell straps remain the same as in FIG. 42. Likewise, the PCB module 4928 includes the same components as the PCB module 3228' of FIG. 44 except the fuses 4934 and 4936 do not include through holes. Instead, laser or resistance welding is used to connect and fuse the power battery cell straps 4822 to the fuses 4934 and 4936. FIG. 50 illustrates weld points 5090 to electrically and mechanically connect the power battery cell straps 4822 to the fuses 4934 and 4936. In a same manner as described above with respect to FIG. 47, laser or resistance welding also may be used at weld points 5010, which are the same weld points as 4710 in FIG. 47.

Figure 53:
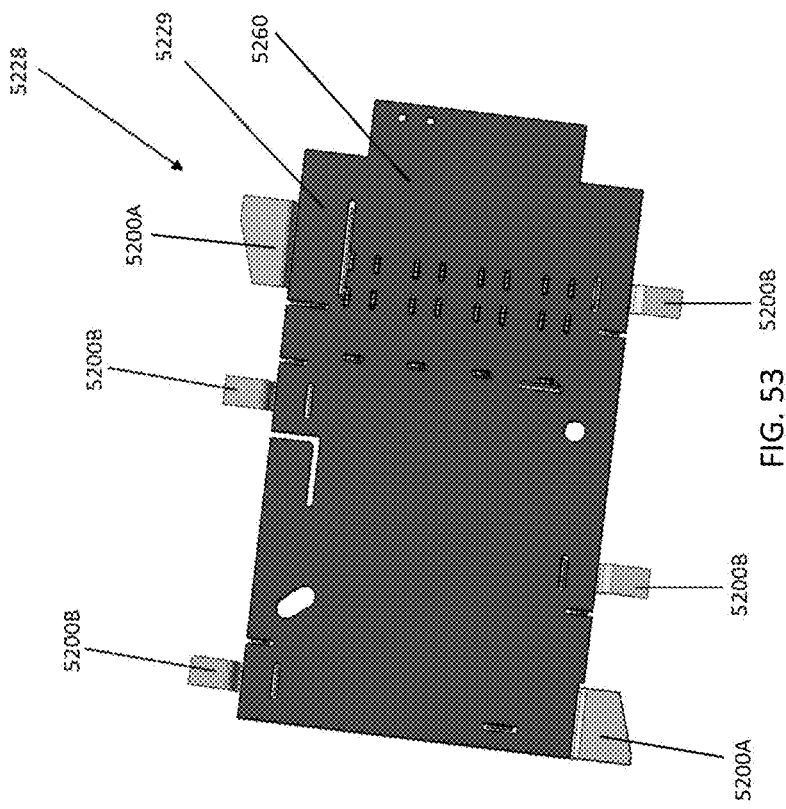
FIG. 53 is an isometric view of a bottom side of the printed circuit board module of FIG. 52.
Figure 52:
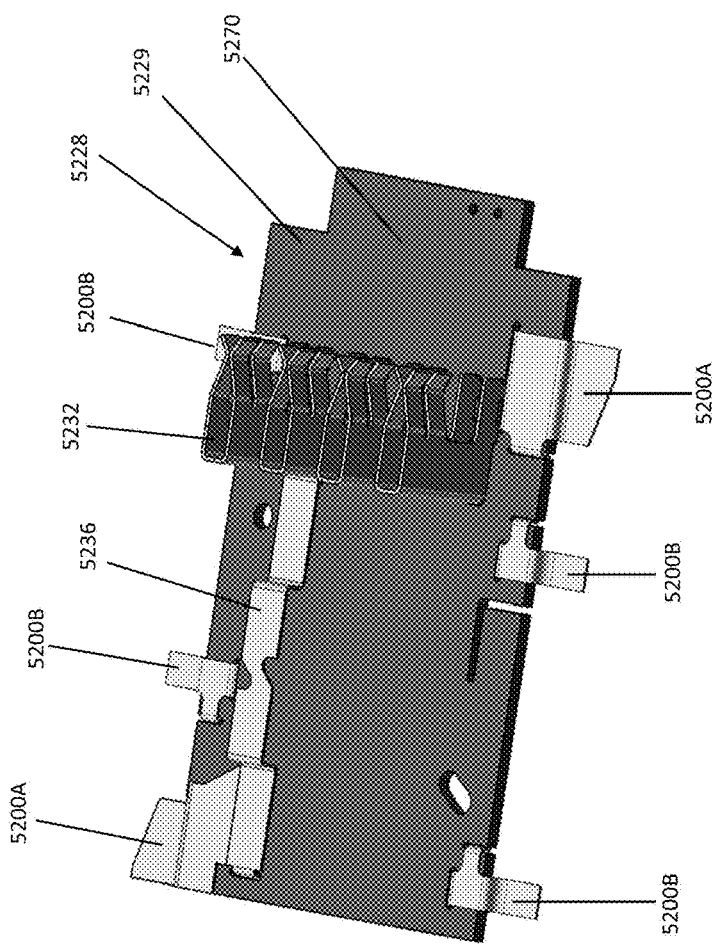
FIG. 52 is an isometric view of a top side of a printed circuit board module according to the example embodiment of FIG. 51.

FIGS. 51-55 illustrate another example embodiment in the assembly of a corepack 5100. As illustrated in the partial view of the corepack 5100 in FIG. 51, a sense module strap 5200B is connected to a sense battery cell strap 5424. As illustrated in FIGS. 52 and 53, there are both sense module straps 5200B and power module straps 5200A. FIG. 52 illustrates a top side 5270 of the PCB 5229 and FIG. 53 illustrates a bottom side 5260 of the PCB 5229. Both the power module straps 5200A and the sense module straps 5200B include a PCB end and a cell end. The PCB end of the power module straps 5200A and the sense module straps 5200B penetrate through through holes in the PCB 5229 and may be wave soldered (or other soldering means) on the bottom side 5260 of the PCB 5229 of the PCB module 5228. The PCB end of one of the power module straps 5200A may be wave soldered to the battery pack terminals 5232 and the PCB end of another of the power module straps 5200A may be wave soldered to a fuse 5236 that connects to the battery pack terminals 5232. The PCB ends of the sense module straps 5200B may be wave soldered to electrical traces (not shown) on the bottom side 5260 of the PCB 5229, where the electrical traces connect to components (not shown) on the bottom side 5260 of the PCB 5229.

Figure 54:
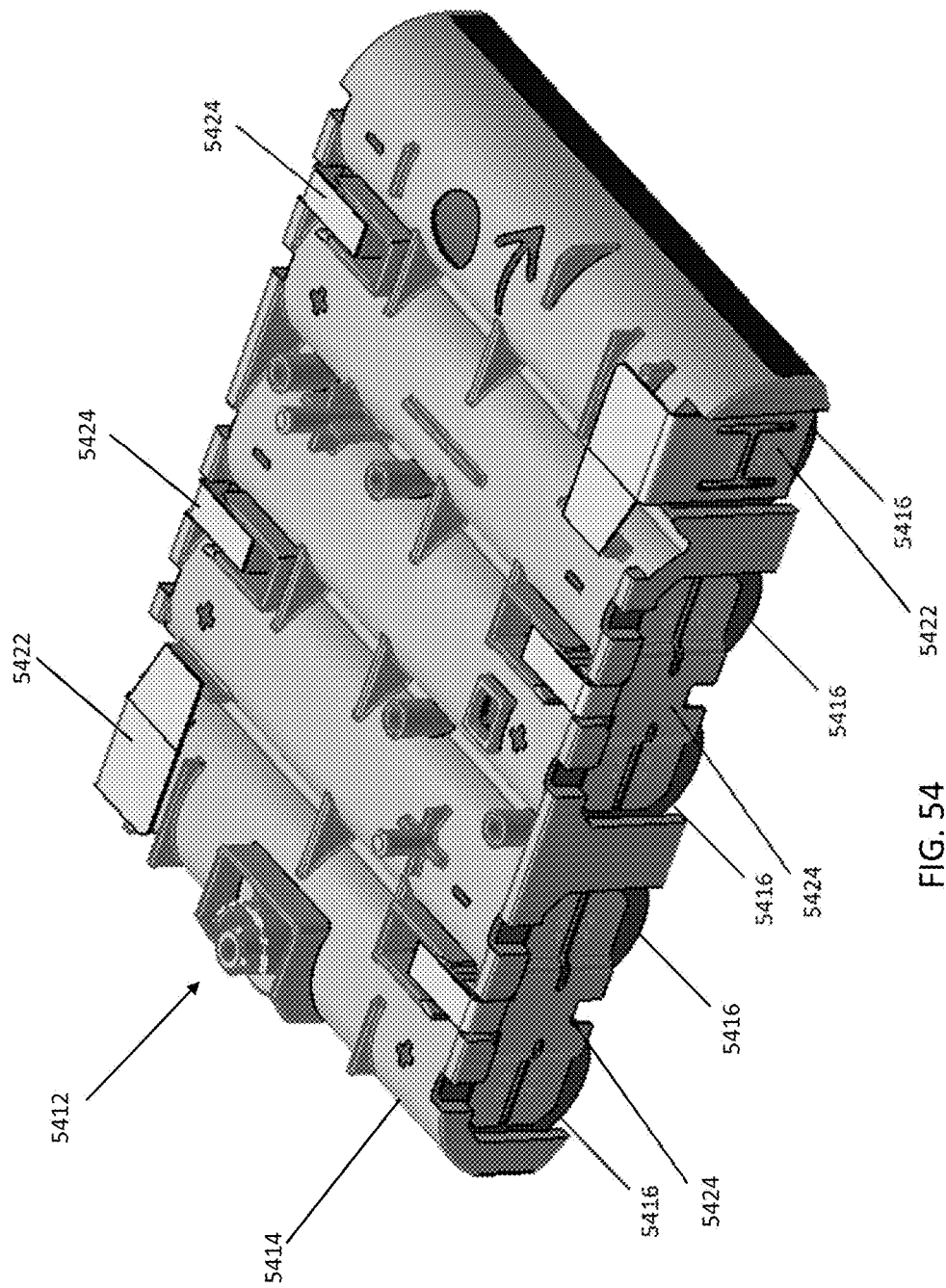
FIG. 54 is an isometric view of a battery according to the example embodiment of FIG. 51.
Figure 55:
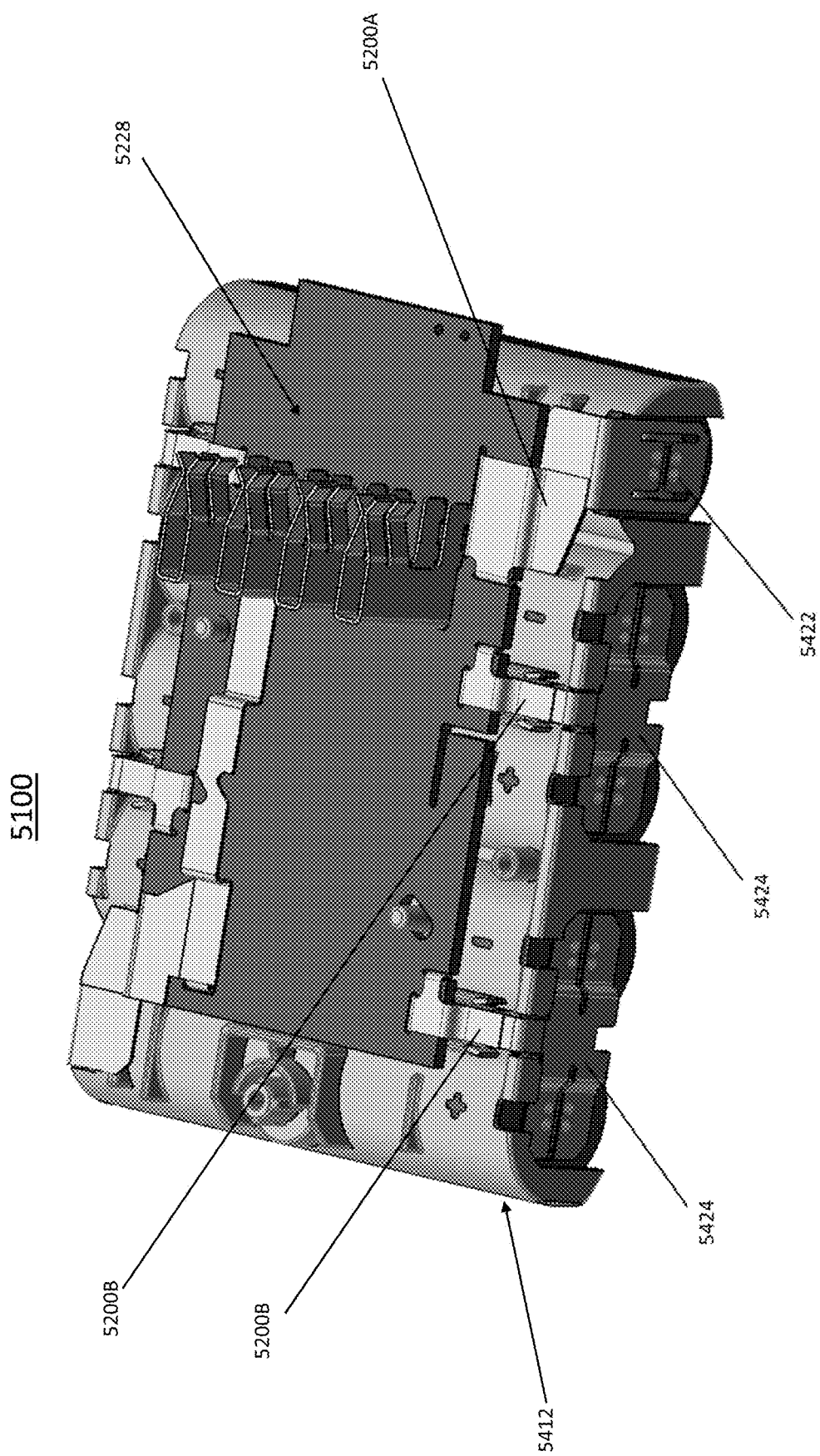
FIG. 55 is an isometric view of the assembled corepack according to the example embodiment of FIG. 51.

The cell end of the power module straps 5200A and the sense module straps 5200B include a flat surface that welded to a corresponding flat surface on power battery cell straps 5422 and sense battery cell straps 5424, shown in FIG. 54, using laser or resistance welding. In this manner, no solder is used in the assembly of the PCB module 5228 with the battery 5412 to form the corepack 5100. FIG. 54 illustrates the battery 5412 with the power battery cell straps 5422 and the sense battery cell straps 5424. The battery cell straps 5422 and 5424 include a cell end that is connected to the battery cells 5416. The battery cell straps 5422 and 5424 include a PCB end that includes a flat surface that is disposed on the battery cell holder 5414. The flat surface on the PCB end of the battery cell straps 5422 and 5424 are welded to the flat surface on the PCB end of the respective power module straps 5200A and sense module straps 5200B, as illustrated in the assembled corepack 5100 in FIG. 55. This forms an electrical connections between the laser or resistance welded components.

Figure 56:
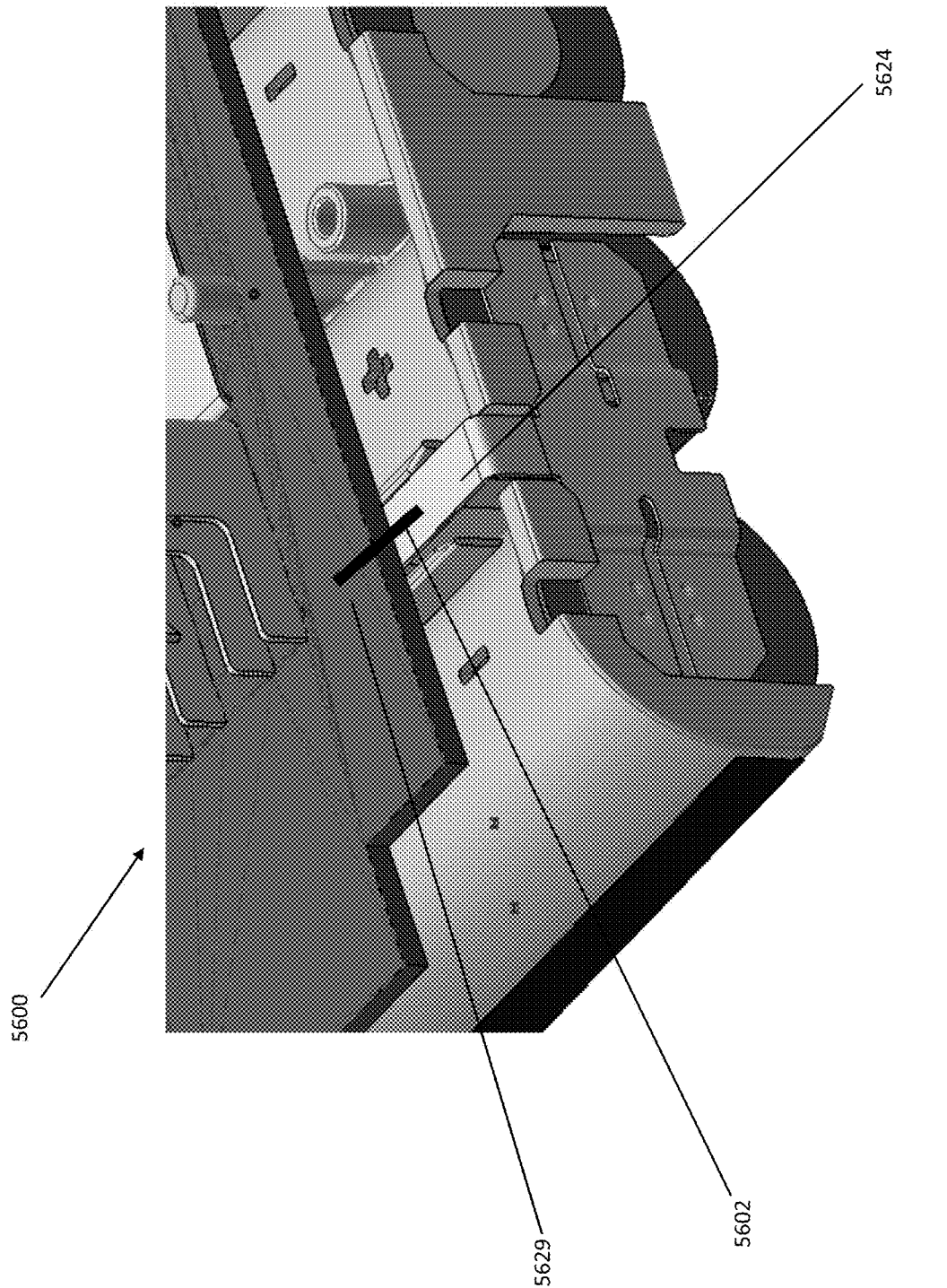
FIG. 56 is an isometric view of a partial corepack using wire bonding in the assembly of the corepack according to another example embodiment.

FIG. 56 illustrates another example embodiment of a corepack 5600 using a wire bond 5602 to create connections between the battery cell straps, such as the sense battery cell strap 5624, and the pad surfaces on the PCB 5629. In some implementations, copper wire may be used as the wire bond 5602. In some implementations, other metal wires may be used as the wire bond 5602. The wire bond 5602 may be pressed on the flat surface of the PCB end of the battery cell straps, such as the sense battery cell strap 5624, and the pad surfaces on the PCB 5629 to create connections with the use of solder. The same technique may be used with power battery cell straps (not shown in this figure).

In one general aspect, a battery pack comprises a plurality of battery cells, a cell holder fixedly holding the plurality of battery cells relative to each other, a plurality of battery straps, each of the plurality of battery straps having a first end coupled to at least one of the plurality of battery cells and a second end, opposed to the first end, a printed circuit board (PCB) having a set of holes extending from a first side of the PCB to a second side of the PCB opposing the first side of the PCB, a first subset of the set of holes sized to receive the second end of the plurality of battery straps, a second subset of the set of holes including pairs of holes, the holes of each pair of holes positioned adjacent to and on opposing sides of a hole of the first subset of holes, an electrical trace on the first side of the PCB extending from one of the holes of each pair of holes to a component mounted on the first side of the PCB and a set of contacts, each contact having a U-shaped body including a center portion and at least one leg, each leg integrally formed with one of the opposing ends of the center portion providing a free end of each leg, the center portion having a through hole sized to receive the second end of the plurality of battery straps, each of the contacts positioned such that the free end of each leg extends from the second side of the PCB to the first side of the PCB through a corresponding hole and the free end of the at least one leg is soldered to the electrical trace extending from the corresponding hole.

The battery pack may include one or more of the following features in any combination with the general aspect. The second end of each of the plurality of battery straps is soldered to the center portion of one contact from the set of contacts. The first side of the PCB faces the cell holder and components are only mounted on the first side of the PCB. The battery pack may further comprise a set of battery pack terminals disposed on the second side of the PCB, and wherein the set of contacts comprises one or more sense contacts and one or more power contacts, the one or more power contacts electrically connected to the set of battery pack terminals. The through hole of each contact of the set of contacts is aligned with a hole of the first subset of the set of holes sized to receive an end of a plurality of battery straps. The at least one leg includes two legs, wherein the two legs of the contact from the set of contacts are approximately perpendicular to the center portion of the contact. The cell holder comprises one or more alignment posts and the PCB comprises one or more alignment holes, wherein each of the one or more alignment holes are configured to receive one of the one or more alignment posts. One or more of the first subset of the set of holes sized to receive the second end of the battery strap is formed as a cutout in a sidewall of the PCB. The plurality of battery straps comprises one or more power battery straps and one or more sense battery straps. The one or more power battery straps comprises a positive power battery strap having a first end coupled to a positive terminal of a battery cell from the plurality of battery cells and a negative power battery strap having a first end coupled to a negative terminal of a battery cell from the plurality of battery cells.

In another general aspect, a printed circuit board module for use in a battery pack comprises a printed circuit board (PCB) having a set of holes extending from a first side of the PCB to a second side of the PCB opposing the first side of the PCB, a first subset of the set of holes sized to receive an end of a plurality of battery straps, a second subset of the set of holes including pairs of holes, the holes of each pair of holes positioned adjacent to and on opposing sides of a hole of the first subset of holes, an electrical trace on the first side of the PCB extending from at least one of the holes of each pair of holes to a component mounted on the first side of the PCB and a set of contacts, each contact having a body including a center portion and at least one leg, each leg having one end and a free end connected to opposing ends of the center portion, the center portion having through hole sized to receive the end of the plurality of battery straps, each of the contacts positioned such that the free end of each leg extends from the second side of the PCB to the first side of the PCB through a corresponding hole and the free end of one of the at least one leg is soldered to the electrical trace extending from the corresponding hole.

The printed circuit board module may include one or more of the following features in any combination with the general aspect. The body of each contact of the set of contacts is substantially U-shaped. The one end of each leg is integrally formed with one of the opposing ends of the center portion. The at least one leg comprises two legs, wherein the two legs of the contact from the set of contacts are approximately perpendicular to the center portion of the contact. The printed circuit board module may further comprise a set of battery pack terminals disposed on the second side of the PCB, and wherein the set of contacts comprises one or more sense contacts and one or more power contacts, the one or more power contacts electrically connected to the set of battery pack terminals. The through hole of each contact of the set of contacts is aligned with a hole of the first subset of the set of holes sized to receive an end of a plurality of battery straps.

In another general aspect, a method for assembling a battery pack corepack includes aligning one or more alignment posts on a battery with one or more corresponding alignment holes on a printed circuit board module, the battery comprising one or more battery straps with a first end of the one or more battery straps connected to one or more corresponding battery cells, the printed circuit board module comprising a printed circuit board (PCB) having a set of through holes extending from a first side of the PCB to a second side of the PCB opposing the first side of the PCB and a set of contacts, each contact having a body including a center portion and two legs, each leg having one end and a free end connected to opposing ends of the center portion, the center portion having through hole, receiving the one or more alignment posts on the battery in the one or more corresponding alignment holes on the printed circuit board module, receiving one or more second ends of the one or more battery straps in one or more corresponding through holes of the center portion of the contact, and electrically connecting the one or more second ends of the one or more battery straps to the corresponding one or more contacts.

The method may include one or more of the following features in any combination with the general aspect. Electrically connecting the one or more second ends of the one or more battery straps comprises soldering the one or more second ends of the one or more battery straps to the corresponding one or more contacts. The method may further comprise aligning the through hole of the center portion of each contact of the set of contacts with an associated through hole extending from the first side of the PCB to the second side of the PCB. The body of each contact of the set of contacts is substantially U-shaped.

Numerous modifications may be made to the example implementations described above. These and other implementations are within the scope of this application.

What is claimed is:

1. A battery pack comprising:
    a plurality of battery cells;
    a cell holder fixedly holding the plurality of battery cells relative to each other;
    a plurality of battery straps, each of the plurality of battery straps having a first end coupled to at least one of the plurality of battery cells and a second end, opposed to the first end;
    a printed circuit board (PCB) having a set of cutouts sized to receive the second end of the plurality of battery straps, a set of vias, a via of the set of vias positioned adjacent to a cutout of the set of cutouts; and
    a set of contacts, each contact including a center portion and at least one leg, each leg integrally formed with the center portion providing a free end of each leg, the center portion having a through hole sized to receive the second end of the plurality of battery straps, each of the contacts positioned such that the free end of each leg extends through a corresponding via.

2. The battery pack as recited in claim 1, wherein the second end of each of the plurality of battery straps is soldered to the center portion of one contact from the set of contacts.

3. The battery pack as recited in claim 1, wherein a first side of the PCB faces the cell holder and components are only mounted on the first side of the PCB.

4. The battery pack as recited in claim 3, further comprising a set of battery pack terminals disposed on a second side of the PCB opposed to the first side and wherein the set of contacts comprises one or more sense contacts and one or more power contacts, the one or more power contacts electrically connected to the set of battery pack terminals.

5. The battery pack as recited in claim 1, wherein the through hole of each contact of the set of contacts is aligned with a cutout of the set of cutouts sized to receive an end of a plurality of battery straps.

6. The battery pack as recited in claim 1, wherein the at least one leg includes two legs and wherein the two legs of the contact from the set of contacts are approximately perpendicular to the center portion of the contact.

7. The battery pack as recited in claim 1, wherein the cell holder comprises one or more alignment posts and the PCB comprises one or more alignment holes and wherein each of the one or more alignment holes are configured to receive one of the one or more alignment posts.

8. The battery pack as recited in claim 1, wherein the plurality of battery straps comprises one or more power battery straps and one or more sense battery straps.

9. The battery pack as recited in claim 8, wherein the one or more power battery straps comprises a positive power battery strap having a first end coupled to a positive terminal of a battery cell from the plurality of battery cells and a negative power battery strap having a first end coupled to a negative terminal of a battery cell from the plurality of battery cells.

10. A printed circuit board module for use in a battery pack, the printed circuit board module comprising:
    a printed circuit board (PCB) having a set of cutouts sized to receive an end of a battery strap of a plurality of battery straps, a set of vias, a via of the set of vias positioned adjacent to a cutout of the set of cutouts; and
    a set of contacts, each contact having a body including a center portion and at least one leg, each leg having one end connected to an end of the center portion and free end opposed to the connected end, the center portion having a through hole sized to receive the end of the battery strap of the plurality of battery straps, each of the contacts positioned such that the free end of each leg extends through a corresponding via.

11. The printed circuit board module as recited in claim 10, wherein the body of each contact of the set of contacts is substantially U-shaped.

12. The printed circuit board module as recited in claim 10, wherein the center portion includes opposing ends and the one end of each leg is integrally formed with each of the opposing ends of the center portion.

13. The printed circuit board module as recited in claim 10, wherein the at least one leg comprises two legs and wherein the two legs of the contact of the set of contacts are approximately perpendicular to the center portion of the contact.

14. The printed circuit board module as recited in claim 10, further comprising a set of battery pack terminals disposed on the PCB and wherein the set of contacts comprises one or more sense contacts and one or more power contacts, the one or more power contacts electrically connected to the set of battery pack terminals.

15. The printed circuit board module as recited in claim 14, wherein the through hole of each contact of the set of contacts is aligned with a via of the set of vias sized to receive an end of a plurality of battery straps.

16. A method for assembling a battery pack corepack, the method comprising:
    providing a battery comprising one or more battery straps with a first end of the one or more battery straps connected to one or more corresponding battery cells;
    providing a printed circuit board module comprising a printed circuit board (PCB) having a set of vias and a set of contacts, each contact having a body including a center portion and at least one leg, each leg integrally formed with the center portion providing a free end of each leg, the center portion having a through hole;
    receiving one or more second ends of the one or more battery straps in one or more corresponding through holes of the center portion of the contact; and
    electrically connecting the one or more second ends of the one or more battery straps to the corresponding one or more contacts.

17. The method as recited in claim 16, wherein electrically connecting the one or more second ends of the one or more battery straps comprises soldering the one or more second ends of the one or more battery straps to the corresponding one or more contacts.

18. The method as recited in claim 16, further comprising aligning the through hole of the center portion of each contact of the set of contacts with an associated cutout.

19. The method as recited in claim 16, wherein the body of each contact of the set of contacts is substantially U-shaped.

\* \* \* \* \*